(12) United States Patent
Cho

(10) Patent No.: US 11,626,166 B2
(45) Date of Patent: Apr. 11, 2023

(54) MEMORY DEVICE FOR PERFORMING TEMPERATURE COMPENSATION AND OPERATING METHOD THEREOF

(71) Applicant: Samsung Electronics Co., Ltd., Suwon-si (KR)

(72) Inventor: Yongsung Cho, Hwaseong-si (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 66 days.

(21) Appl. No.: 17/229,053

(22) Filed: Apr. 13, 2021

(65) Prior Publication Data

US 2022/0068399 A1 Mar. 3, 2022

(30) Foreign Application Priority Data

Aug. 27, 2020 (KR) .................. 10-2020-0108539

(51) Int. Cl.
*G11C 16/24* (2006.01)
*G11C 16/04* (2006.01)
*G11C 16/26* (2006.01)
*G11C 16/32* (2006.01)
*H01L 27/11582* (2017.01)

(52) U.S. Cl.
CPC .......... *G11C 16/24* (2013.01); *G11C 16/0483* (2013.01); *G11C 16/26* (2013.01); *G11C 16/32* (2013.01); *H01L 27/11582* (2013.01)

(58) Field of Classification Search
CPC ..... G11C 16/24; G11C 16/0483; G11C 16/26; G11C 16/32; G11C 16/34; G11C 7/04; G11C 16/10; H01L 27/11582

USPC .................................................. 365/185.12
See application file for complete search history.

(56) References Cited

U.S. PATENT DOCUMENTS

| 7,257,028 B2 | 8/2007 | Lee et al. |
| 7,679,133 B2 | 3/2010 | Son et al. |
| 8,553,466 B2 | 10/2013 | Han et al. |
| 8,559,235 B2 | 10/2013 | Yoon et al. |

(Continued)

OTHER PUBLICATIONS

Extended European Search Report dated Oct. 5, 2021 issued in corresponding European Appln. No. 21173742.4.

*Primary Examiner* — Hoai V Ho
*Assistant Examiner* — Minh Dinh
(74) *Attorney, Agent, or Firm* — Harness, Dickey & Pierce, P.L.C.

(57) ABSTRACT

A memory device for performing temperature compensation and an operating method thereof are provided. The memory device includes a memory cell array; a page buffer circuit connected to the memory cell array through a plurality of bit lines, including a page buffer connected to each of the plurality of bit lines, and configured to perform a pre-charge operation during a pre-charge period for data reading; and a control logic configured to differently control the pre-charge operation of the page buffer circuit according to a detected temperature, wherein the pre-charge period includes a first period in which the plurality of bit lines are overdriven and a second period in which the plurality of bit lines are driven at a voltage lower than that of the first period, and the first period where the detected temperature is a first temperature is set to be shorter than the second period where the detected temperature is a second temperature higher than the first temperature.

20 Claims, 19 Drawing Sheets

(56) References Cited

U.S. PATENT DOCUMENTS

| | | |
|---|---|---|
| 8,654,587 B2 | 2/2014 | Yoon et al. |
| 9,437,314 B2 | 9/2016 | Shin |
| 9,478,261 B1 | 10/2016 | Lim et al. |
| 9,672,924 B2 | 6/2017 | Cho et al. |
| 9,905,301 B2 | 2/2018 | Yoo et al. |
| 10,339,989 B2 | 7/2019 | Kim et al. |
| 2008/0211572 A1 | 9/2008 | Riho |
| 2011/0233648 A1 | 9/2011 | Seol et al. |
| 2013/0194872 A1* | 8/2013 | Sim ........................ G11C 16/26 365/185.25 |
| 2017/0133096 A1* | 5/2017 | Yoo ........................ G11C 16/24 |
| 2017/0262337 A1 | 9/2017 | Chang et al. |
| 2018/0197587 A1* | 7/2018 | Lee ..................... G11C 11/5642 |

* cited by examiner

MEMORY DEVICE FOR PERFORMING TEMPERATURE COMPENSATION AND OPERATING METHOD THEREOF

CROSS-REFERENCE TO RELATED APPLICATION

This application is based on and claims priority under 35 U.S.C. § 119 to Korean Patent Application No. 10-2020-0108539, filed on Aug. 27, 2020, in the Korean Intellectual Property Office, the disclosure of which is incorporated by reference herein in its entirety.

BACKGROUND

The inventive concepts relate to a memory device, and more particularly, to a memory device for performing temperature compensation and an operating method thereof.

Recently, according to the multifunctionalization of information communication devices, a larger capacity and/or a higher integration of memory devices may be advantageous. A memory device may include a page buffer connected to lines of memory cells (e.g., 88 bit lines) to store data in or output data from the memory cells, and the page buffer may include semiconductor devices such as transistors. The operating characteristics of the page buffer may vary according to the temperature change of the memory device, which may cause occurrence of an operation error or degradation of the reliability of data during a process of writing and/or reading data.

SUMMARY

The inventive concepts provide a memory device capable of reducing an operation error and improving a data reading speed by applying compensation for a temperature change to drive a page buffer, and an operating method thereof.

According to an aspect of the inventive concepts, there is provided a memory device including a memory cell array including a plurality of memory cells; a page buffer circuit connected to the memory cell array through a plurality of bit lines, including a page buffer connected to each bit line, and configured to perform a pre-charge operation on the plurality of bit lines during a pre-charge period for data reading; and a control logic configured to differently control the pre-charge operation of the page buffer circuit according to a detected temperature, wherein the pre-charge period includes a first period in which the plurality of bit lines are overdriven and a second period in which the plurality of bit lines are driven at a voltage lower than that of the first period, and the first period where the detected temperature is a first temperature is set to be shorter than the second period where the detected temperature is a second temperature higher than the first temperature.

According to another aspect of the inventive concepts, there is provided a memory device including a memory cell array including a plurality of memory cells; a page buffer circuit connected to the memory cell array through a plurality of bit lines, including a plurality of page buffers respectively connected to the plurality of bit lines, and configured to perform a pre-charge operation on the plurality of bit lines during a pre-charge period for data reading; and wherein each page buffer includes a shutoff transistor configured to control an electrical connection between a sensing node and each bit line, wherein a bit line shutoff signal is provided to a gate of the shutoff transistor, wherein the pre-charge period includes an initial first period in which an over drive is performed and a second period thereafter, and wherein, when a temperature of the memory device is lower, a first offset corresponding to a voltage variation of the bit line shutoff signal between the first period and the second period is smaller than, when the temperature is higher, a second offset corresponding to a voltage variation of the bit line shutoff signal between the first period and the second period.

According to another aspect of the inventive concepts, there is provided a memory device including a memory cell area including a plurality of memory cells and a first metal pad; and a peripheral circuit area including a second metal pad, and vertically connected to the memory cell area through the first metal pad and the second metal pad, wherein the peripheral circuit area includes a page buffer circuit connected to the memory cells through a plurality of bit lines, including a page buffer connected to each of the plurality of bit lines, and configured to perform a pre-charge operation on the plurality of bit lines during a pre-charge period for data reading; and a control logic configured to differently control the pre-charge operation of the page buffer circuit according to a temperature, and wherein the pre-charge period includes an initial first period in which an over drive is performed and a second period thereafter, and when a temperature of the memory device is lower, a first offset corresponding to a voltage variation of the bit line shutoff signal between the first period and the second period is smaller than, when the temperature is higher, a second offset corresponding to a voltage variation of the bit line shutoff signal between the first period and the second period.

BRIEF DESCRIPTION OF THE DRAWINGS

Example embodiments of the inventive concepts will be more clearly understood from the following detailed description taken in conjunction with the accompanying drawings in which.

DETAILED DESCRIPTION OF EMBODIMENTS

Hereinafter, example embodiments of the inventive concepts will be described in detail with reference to the accompanying drawings.

Figure 1:
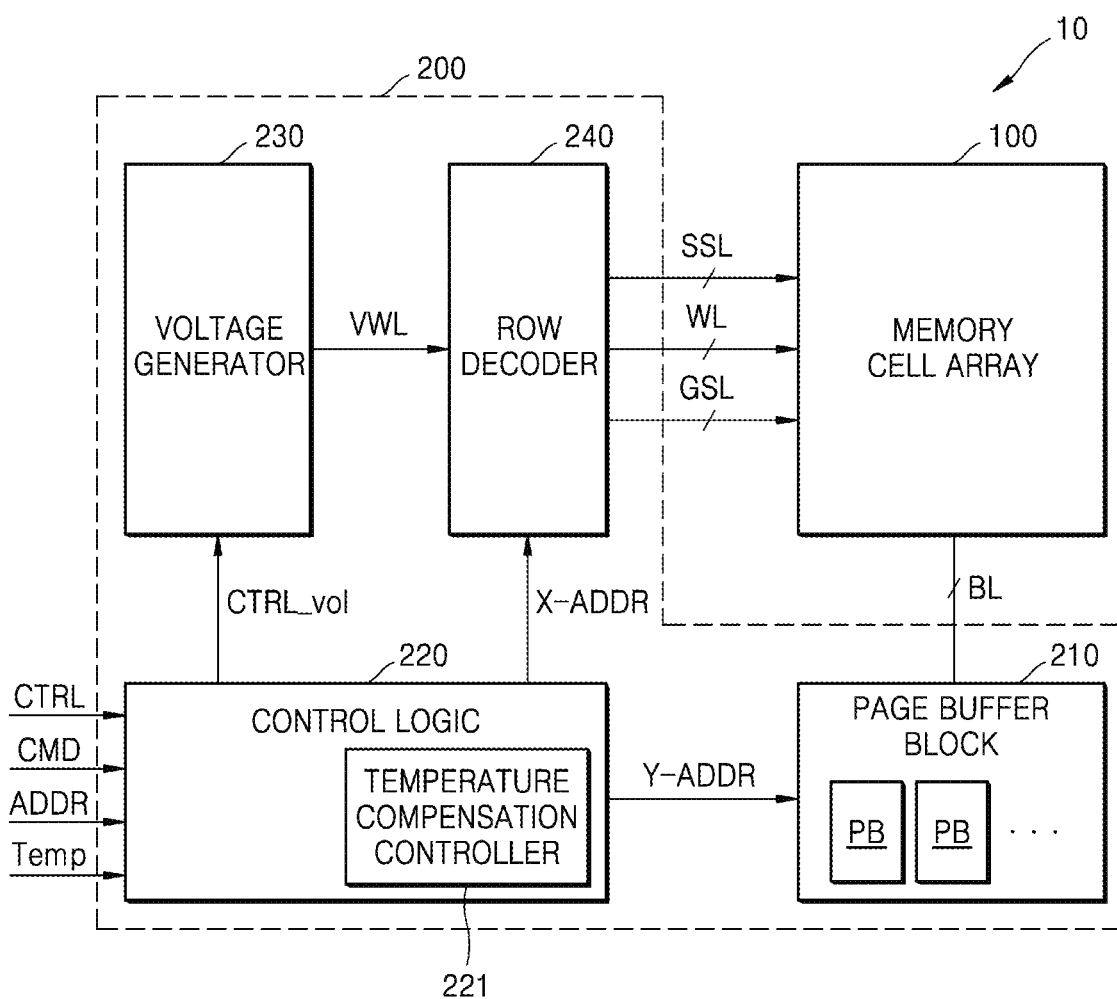
FIG. 1 is a block diagram illustrating a memory device according to example embodiments of the inventive concepts.

FIG. 1 is a block diagram illustrating a memory device 10 according to example embodiments of the inventive concepts.

Referring to FIG. 1, the memory device 10 may include a memory cell array 100 and/or a peripheral circuit 200, and the peripheral circuit 200 may include a page buffer block (or, a page buffer circuit) 210, a control logic 220, a voltage generator 230 and/or a row decoder 240. Although not shown in FIG. 1, the peripheral circuit 200 may further include a data input/output circuit or an input/output interface. Further, the peripheral circuit 200 may further include a column logic, a pre-decoder, a temperature sensor, a command decoder, an address decoder, and/or the like.

The memory cell array 100 may be connected to the page buffer circuit 210 through bit lines BL, and may be connected to the row decoder 240 through word lines WL, string selection lines SSL, and ground selection lines GSL. The memory cell array 100 may include a plurality of memory cells, and for example, the memory cells may be flash memory cells. Hereinafter, example embodiments of the inventive concepts in which the plurality of memory cells are NAND flash memory cells will be described in detail as an example. However, the inventive concepts are not limited thereto, and in some example embodiments, the plurality of memory cells may be resistive memory cells such as resistive RAM (ReRAM), phase change RAM (PRAM), Ferroelectric RAM (FRAM), or magnetic RAM (MRAM).

In example embodiments, the memory cell array 100 may include a 3D memory cell array, and the 3D memory cell array may include a plurality of NAND strings, each of which may include memory cells respectively connected to word lines stacked vertically on a substrate, which will be described in detail with reference to FIGS. 3 and 4. U.S. Pat. Nos. 7,679,133, 8,553,466, 8,654,587, and 8,559,235, and U.S. Patent Application Publication No. 2011/0233648 disclose example configurations of a 3D memory array including a plurality of levels and sharing word lines and/or bit lines between the levels, and are incorporated herein by reference. However, the inventive concepts are not limited thereto, and in some example embodiments, the memory cell array 100 may include a two-dimensional (2D) memory cell array, and the 2D memory cell array may include a plurality of NAND strings arranged in row and column directions.

The control logic 220 may output various control signals, for example, a voltage control signal CTRL_vol, a row address X-ADDR, and a column address Y-ADDR for writing or programing data to the memory cell array 100, reading data from the memory cell array 100, and erasing data stored in the memory cell array 100, based on a command CMD, an address ADDR, and a control signal CTRL. Accordingly, the control logic 220 may generally control various operations within the memory device 10.

The voltage generator 230 may generate various types of voltages for performing program, read, and erase operations on the memory cell array 100 based on the voltage control signal CTRL_vol. For example, the voltage generator 230 may generate a word line voltage, for example, a program voltage, a read voltage, a pass voltage, an erase verification voltage, or a program verification voltage. Also, the voltage generator 230 may further generate a string selection line voltage and a ground selection line voltage based on the voltage control signal CTRL_vol. Also, the voltage generator 230 may generate one or more voltages for driving or controlling the page buffer circuit 210 according to example embodiments of the inventive concepts.

The row decoder 240 may select one of a plurality of memory blocks, select one of the word lines WL of the selected memory block, and select one of the plurality of string selection lines SSL, in response to the row address X-ADDR. The page buffer circuit 210 may select some of the bit lines BL in response to the column address Y-ADDR. For example, the page buffer circuit 210 may operate as a write driver or a sense amplifier according to an operation mode.

The page buffer circuit 210 may include a plurality of page buffers PB connected to the plurality of bit lines BL. Each of the page buffers PB may be connected to the corresponding bit line BL among the plurality of bit lines BL. The page buffer circuit 210 may temporarily store data read from the memory cell array 100 or may temporarily store data to be written in the memory cell array 100. For example, each of the page buffers PB may include one or more latches. Latches may temporarily store data.

As an implementation example, each of the page buffers PB may include one or more transistors and one or more latches related to an operation of temporarily storing data. For example, each of the page buffers PB may perform a pre-charge operation on the bit line BL based on the switching operation of one or more transistors, and may sense data through a sensing node (not shown) as the sensing node and the bit line BL are electrically connected to each other. Also, based on the switching operation of the transistors, data stored in one latch may be moved to another latch, data to be written may be provided to the memory cell array 100 through the bit line BL, or the read data may be provided external to, or outside of the memory device 10 through the bit line BL.

As an implementation example, each of the page buffers PB may include one or more transistors for controlling a pre-charge operation, and characteristics of the transistors may change according to a temperature of the memory device 10 or a system in which the memory device 10 is employed. As an example, each of the page buffers PB may include a shutoff transistor electrically connecting the bit line BL to a sensing node, and the shutoff transistor may be controlled by a bit line shut off signal BLSHF applied to a gate. The level of current flowing through the shutoff transistor may vary according to a change in the temperature of the memory device 10 or the system in which the memory device 10 is employed. For example, the shutoff transistor may operate in a saturation region, and in some example embodiments, as the temperature decreases, the level of the current flowing through the shutoff transistor may increase. In a charge trap flash (CTF)-based vertical structure NAND (VNAND) cell included in the memory cell array 100, the cell current may decrease as the temperature decreases.

In order to reduce the time required for the pre-charge operation, overdrive with respect to the bit line BL may be applied. As an example, the pre-charge period may include a first period in which the bit line shutoff signal BLSHF is applied at a higher level to perform overdriving and a second period in which the bit line shutoff signal BLSHF is applied and maintained at a lower level to bias the bit line BL to a target level. At this time, to compensate for the characteristic in which the cell current is reduced at a lower temperature, in performing overdrive in the first period, the level of the bit line shutoff signal BLSHF at a lower temperature may be set to be higher than that of the bit line shutoff signal BLSHF at a higher temperature.

According to example embodiments of the inventive concepts, the memory device 10 may include a temperature sensor (not shown) for sensing a temperature, and the control logic 220 may generate internal control signals (not shown) for controlling at least one component of the peripheral circuit 200 such that a data read operation according to example embodiments of the inventive concepts may be performed based on temperature information Temp. As an example, the temperature compensation controller 221 may include control information for differently controlling various circuits in the page buffer circuit 210 according to temperature or differently setting times of the first and second periods described above, and the control logic 220 may control the pre-charge operation and/or a data sensing operation on the bit line BL based on the control information of the temperature compensation controller 221.

According to an implementation example, the level of the bit line shutoff signal BLSHF may be set in the first and second periods of the pre-charge operation, and a level difference (or an BLSHF level vBLSHF offset) of the bit line shutoff signal BLSHF may be set differently in the first and second periods according to the temperature change. As an example, as the temperature decreases, the vBLSHF offset may be set smaller. For example, when the temperature is lower, a difference between the level of the bit line shutoff signal BLSHF in the first period and the level of the bit line shutoff signal BLSHF in the second period may be set to be smaller such that the degree to which the bit line BL is over pre-charged may be reduced in the first period. When the temperature is higher, the effect of overdriving on the bit line BL is smaller, and accordingly, as the temperature increases, the vBLSHF offset may be set to be larger compared to the lower temperature.

In addition, the time of the first period may be set differently within a pre-charge period depending on the temperature. For example, the lower the temperature, the shorter the first period within the pre-charge period, whereas the higher the temperature, the longer the first period within the pre-charge period. Alternatively, according to example embodiments, the second period may be set to have the same time in response to the temperature change, and in some example embodiments, the total time of the pre-charge period may decrease as the temperature decreases. Alternatively, according to various example embodiments, the time of the data sensing period may be set differently according to the temperature change, and as an example, the lower the temperature, the longer the time of the data sensing period may be set. Accordingly, the entire time period for data reading may have the same or substantially the same or similar time when the temperature is higher and lower.

According to example embodiments of the inventive concepts as described above, temperature compensation in relation to the level of the bit line shutoff signal BLSHF and the time of the first and second periods is differentially applied to each of the first and second periods, and accordingly, the page buffer circuit 210 is better or optimally driven in response to the temperature change, and thus, an error ratio may remain lower. For example, as described above, the current level of the shutoff transistor may increase as the temperature decreases. In some example embodiments, there may be a problem in that as the bit line BL is over pre-charged in the first period, the second period in which the bit line BL is biased to the target level increases. According to example embodiments of the inventive concepts, the above problem may be improved by adjusting the vBLSHF offset differently depending on the temperature or adjusting the time of the first period differently. That is, the second period in which the bit line BL is biased to the target level may be reduced or prevented from unnecessarily increasing by performing temperature compensation considering the characteristics of the transistor (e.g., the shutoff transistor) included in the page buffer PB in the first period, and accordingly, the total time required for reading data may be reduced, thereby improving read performance.

The memory device 10 in the example embodiments illustrated in FIG. 1 may be referred to as a storage device. For example, the storage device is a device that stores data under the control of a host device such as a computer, a smart phone, or a smart pad. The storage device may be a device that stores data in a semiconductor memory, in particular, a nonvolatile memory device, such as a solid state drive (SSD) or a memory card. Although not shown in FIG. 1, the storage device may further include a controller that controls the memory device 10, and the controller may control data storage and read operations on the memory device 10 according to a request from the host device. As an example, the controller may provide the above-described command CMD, address ADDR, and control signal CTRL to the memory device 10.

Figure 2:
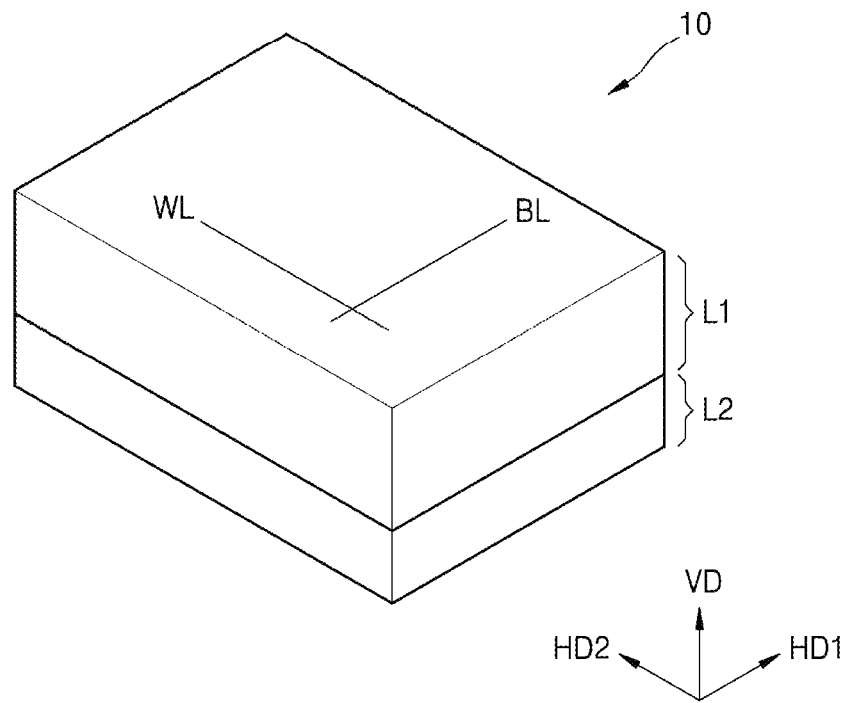
FIG. 2 is a diagram schematically illustrating a structure of the memory device of FIG. 1, according to example embodiments of the inventive concepts.

FIG. 2 is a diagram schematically illustrating a structure of the memory device 10 of FIG. 1, according to example embodiments of the inventive concepts. In FIG. 2, a cell over periphery (COP) structure is exemplified as an implementation example of the memory device 10, but example embodiments of the inventive concepts are not limited thereto, and the memory device 10 may be implemented through various structures.

Referring to FIG. 2, the memory device 10 may include a first semiconductor layer L1 and a second semiconductor layer L2, and the first semiconductor layer L1 may be stacked with respect to the second semiconductor layer L2 in the vertical direction VD. For example, the second semiconductor layer L2 may be disposed on a lower portion of the first semiconductor layer L1 in the vertical direction VD, and accordingly, the second semiconductor layer L2 may be disposed close to a substrate.

In example embodiments, the memory cell array 100 of FIG. 1 may be formed on the first semiconductor layer L1, and the peripheral circuit 200 of FIG. 1 may be formed on the second semiconductor layer L2. Accordingly, the memory device 10 may have a structure in which the memory cell array 100 is disposed above the peripheral circuit 200, that is, a COP structure. The COP structure may effectively reduce an area in the horizontal direction and improve integration of the memory device 10.

In example embodiments, the second semiconductor layer L2 may include the substrate, and transistors and metal patterns (e.g., first and third lower metal layers LM0 and LM2 of FIG. 9) for wiring transistors are formed on the substrate, and thus, the peripheral circuit 200 may be formed on the second semiconductor layer L2. After the peripheral circuit 200 is formed on the second semiconductor layer L2, the first semiconductor layer L1 including the memory cell array 100 may be formed, and the metal patterns for electrically connecting the word lines WL to the bit lines BL of the memory cell array 100 and the peripheral circuit 200 formed in the second semiconductor layer L2 may be formed. For example, the bit lines BL may extend in a first horizontal direction HD1 and the word lines WL may extend in a second horizontal direction HD2.

Figure 3:
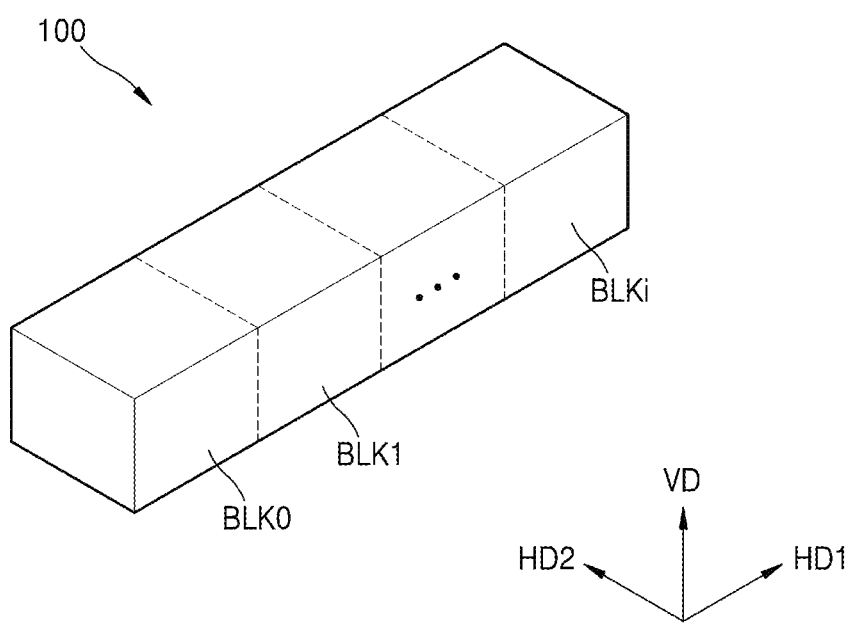
FIG. 3 is a diagram illustrating a memory cell array of FIG. 1 according to example embodiments of the inventive concepts.

FIG. 3 is a diagram illustrating the memory cell array 100 of FIG. 1 according to example embodiments of the inventive concepts.

Referring to FIG. 3, the memory cell array 100 may include a plurality of memory blocks BLK0 to BLKi, and i may be a positive integer. Each of the plurality of memory blocks BLK0 to BLKi may have a 3D structure (or a vertical structure). For example, each of the plurality of memory blocks BLK0 to BLKi may include a plurality of NAND strings extending long in the vertical direction VD. In some example embodiments, the plurality of NAND strings may be spaced apart by a specific distance in the first and second horizontal directions HD1 and HD2. The plurality of memory blocks BLK0 to BLKi may be selected by the row decoder (240 in FIG. 1). For example, the row decoder 240 may select a memory block corresponding to a block address from among the plurality of memory blocks BLK0 to BLKi.

Figure 4:
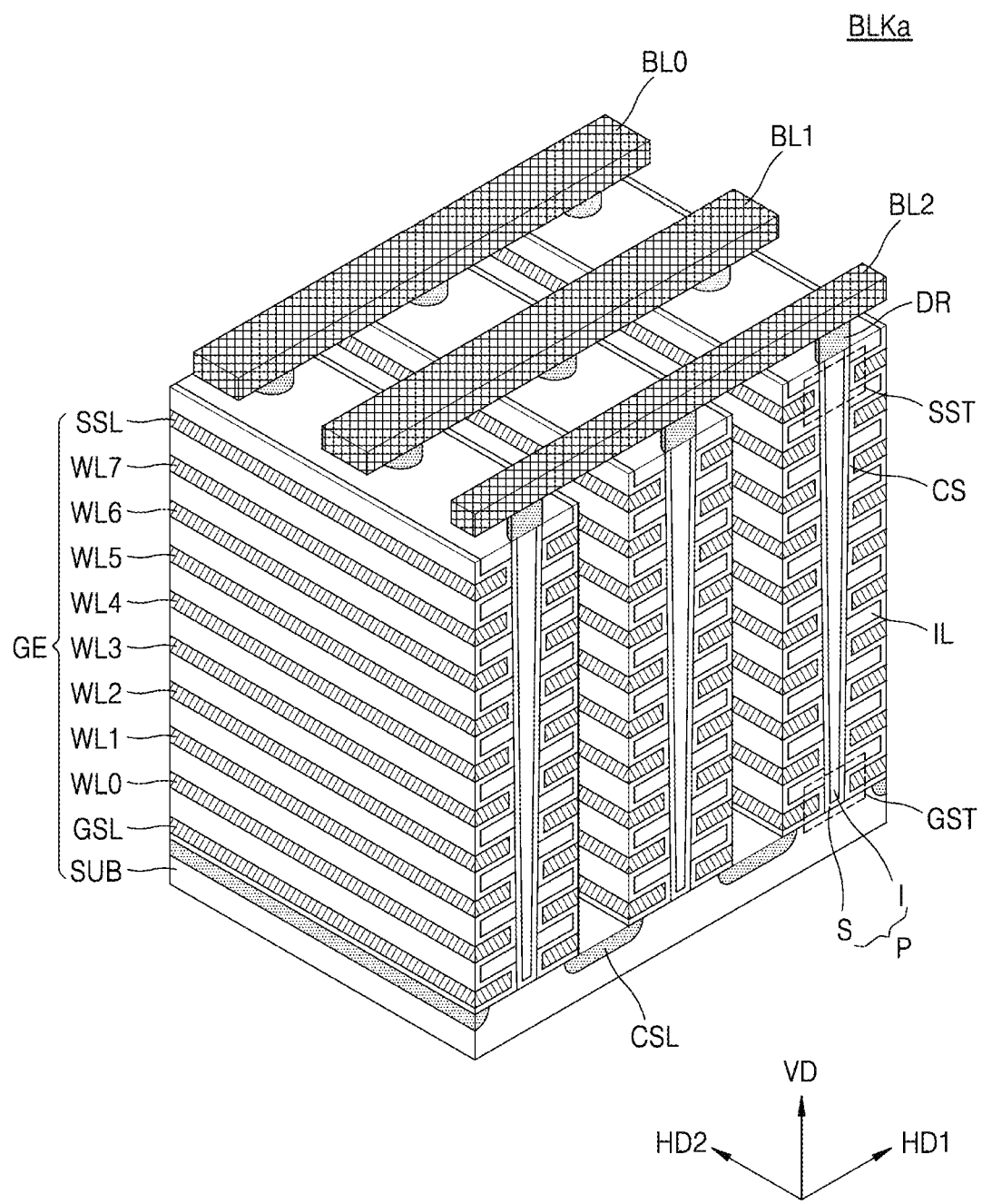
FIG. 4 is a perspective view illustrating a memory block of FIG. 3 according to example embodiments of the inventive concepts.

FIG. 4 is a perspective view illustrating a memory block BLKa of FIG. 3 according to example embodiments of the inventive concepts.

Referring to FIG. 4, the memory block BLKa is formed in a direction perpendicular to a substrate SUB. The substrate SUB includes a common source line CSL that has a first conductivity type (e.g., p type), extends long in the second horizontal direction HD2 on the substrate SUB, and is doped with impurities of a second conductivity type (e.g., n type). On a region of the substrate SUB between two adjacent common source lines CSL, a plurality of insulating layers IL extending long in the second horizontal direction HD2 are sequentially provided in the vertical direction VD. The plurality of insulating layers IL are spaced apart by a specific distance in the vertical direction VD. For example, the plurality of insulating layers IL may include an insulating material such as silicon oxide.

On a region of the substrate SUB between two adjacent common source lines CSL, a plurality of pillars P that are sequentially disposed in the first horizontal direction HD1 and penetrate the plurality of insulating layers IL in the vertical direction VD are provided. For example, the plurality of pillars P may pass through the plurality of insulating layers IL to make contact with the substrate SUB. For example, a surface layer S of each pillar P may include a silicon material having a first type, and may function as a channel region. An inner layer I of each pillar P may include an insulating material such as silicon oxide or an air gap.

In a region between the two adjacent common source lines CSL, a charge storage layer CS is provided along exposed surfaces of the insulating layers IL, the pillars P, and the substrate SUB. The charge storage layer CS may include a gate insulating layer (or referred to as a 'tunneling insulating layer'), a charge trap layer, and a blocking insulating layer. For example, the charge storage layer CS may have an oxide-nitride-oxide (ONO) structure. In addition, in a region between two adjacent common source lines CSL, on the exposed surface of the charge storage layer CS, gate electrodes GE such as selection lines GSL and SSL and word lines WL0 to WL7 are provided.

Drains or drain contacts DR are provided on the plurality of pillars P, respectively. For example, the drains or drain contacts DR may include a silicon material doped with impurities having a second conductivity type. Bit lines BL1 to BL3 extending longer in the first horizontal direction HD1 and spaced apart by a specific distance in the second horizontal direction HD2 are provided on the drains DR.

Figure 5:
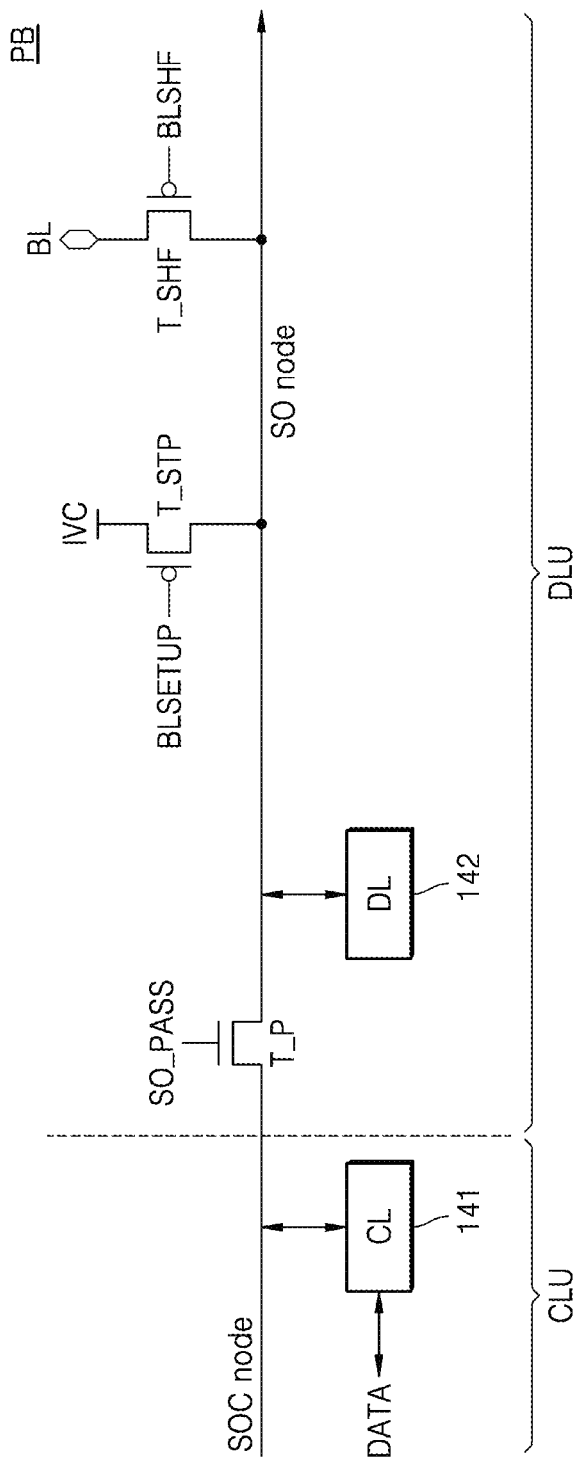
FIG. 5 is a circuit diagram illustrating an example implementation of a page buffer according to example embodiments of the inventive concepts.

FIG. 5 is a circuit diagram illustrating an example implementation of a page buffer PB according to example embodiments of the inventive concepts.

Referring to FIG. 5, the page buffer PB may include a cache latch unit CLU and a data latch unit DLU. The cache latch unit CLU may include a cache latch CL. For example, the cache latch CL may store data to be written to a memory cell. Also, the cache latch CL may store the data DATA transmitted from a data latch DL. The cache latch CL may be connected to a cache latch node SOC. The cache latch CL may transmit and receive the data DATA through the cache latch node SOC. In FIG. 5, one cache latch CL is shown in the cache latch unit CLU, but the cache latch unit CLU may include two or more cache latches CL. The cache latch node SOC may be connected to a sensing node SO through a pass transistor T_P.

The pass transistor T_P may be turned on or off according to a pass signal SO_PASS. When the pass transistor T_P is turned on, the data DATA may be transferred between the cache latch CL and the data latch DL. For example, the data latch DL may be connected to the sensing node SO and may store the data DATA transmitted from the cache latch CL. In addition, the data latch DL may store data DATA read from a memory cell and transmit the data DATA to the cache latch CL. In FIG. 5, one data latch DL is illustrated in the data latch unit DLU, but the data latch unit DLU may include two or more data latches DL.

The sensing node SO may be pre-charged during a read, write, or erase operation of the memory device 10. For example, the sensing node SO may be pre-charged according to an internal supply voltage IVC through a setup transistor T_STP. The setup transistor T_STP may be turned on or off according to a bit line setup signal BLSETUP. The setup transistor T_STP may be a P-type transistor. However, the type of the setup transistor T_STP is not limited thereto. For example, the sensing node SO may be connected to the bit line BL through a shutoff transistor T_SHF. The shutoff transistor T_SHF may be turned on or off according to a bit line shutoff signal BLSHF. The shutoff transistor T_SHF may be an N-type transistor. However, the type of the shutoff transistor T_SHF is not limited thereto.

According to the above-described example embodiments, the page buffer PB may be controlled differently in response to a temperature change, and as an example of operation, the shutoff transistor T_SHF may be controlled differently in first and second periods of a pre-charge operation. For example, an offset (an vBLSHF offset) of the bit line shutoff signal BLSHF may be controlled differently according to the temperature change, and the lower the temperature, the lower the BLSHF offset may be set compared to the higher temperature. In addition, at least one of the first period and the second period may be differently adjusted according to the temperature, and as an example, the lower the temperature, the shorter the first period in which overdrive is performed may be set.

Figure 6A:
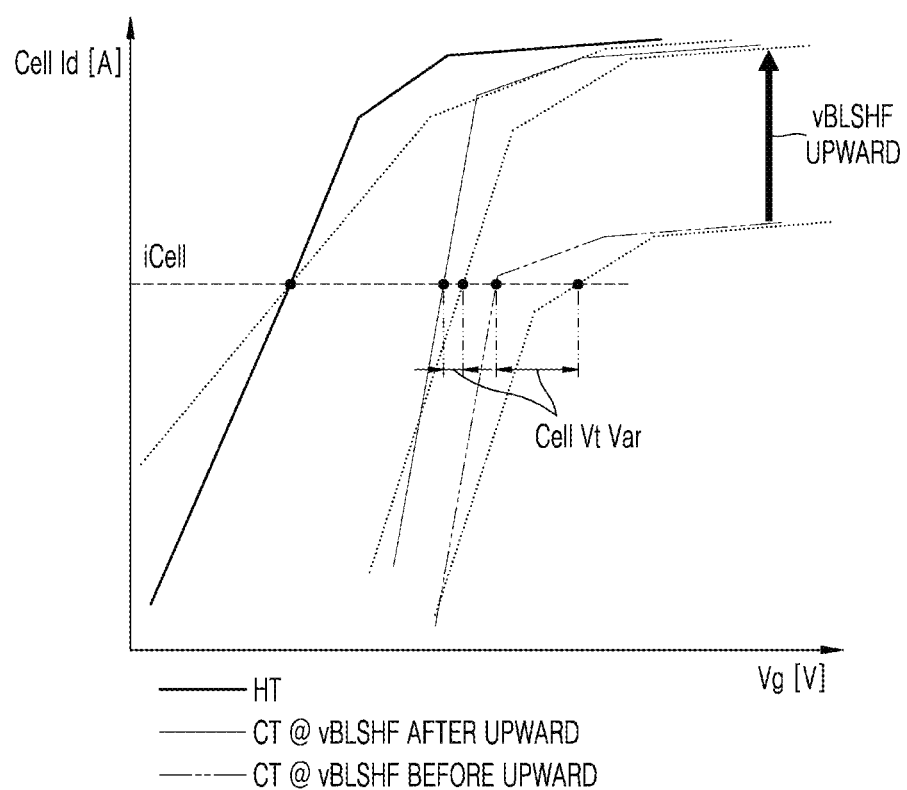
FIGS. 6A and 6B are graphs showing a change in cell current and a change in sensing reference current according to temperature respectively.
Figure 6B:
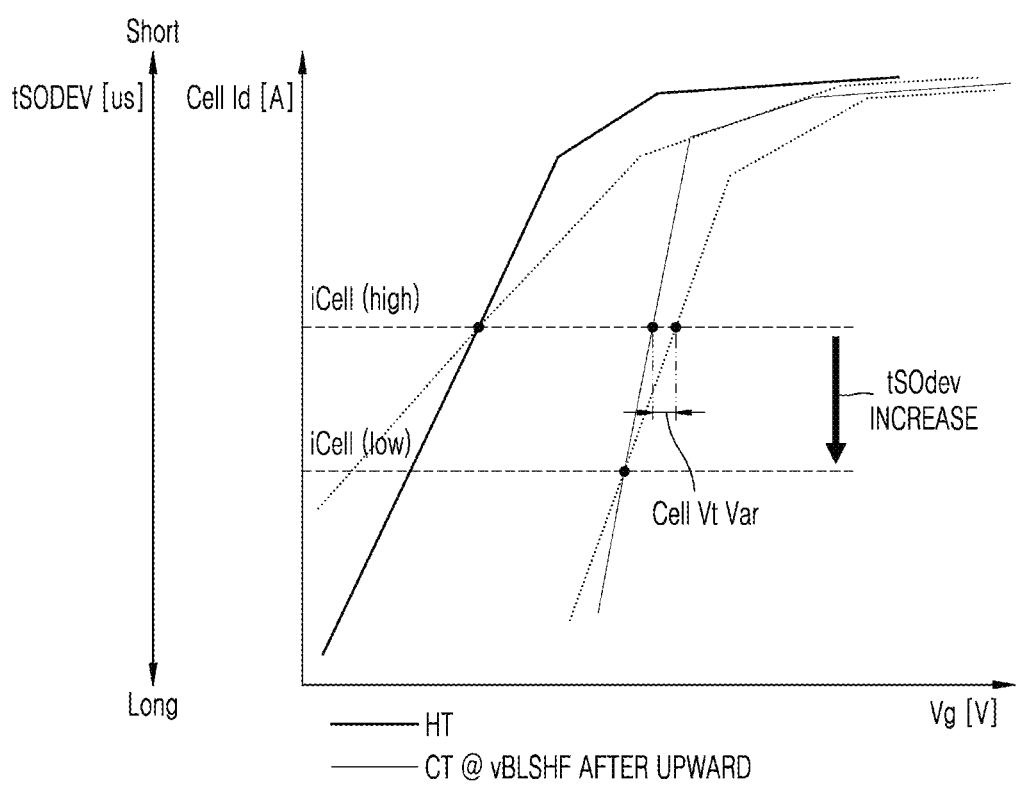

FIGS. 6A and 6B are graphs showing a change in cell current Id and a change in sensing reference current iCell according to temperature, respectively.

Referring to FIGS. 5 and 6A, in a CTF-based vertical structure NAND (VNAND) cell, the cell current Id decreases as the temperature decreases. Memory cells may have a voltage Vg-cell current Id characteristic as shown in FIG. 6A, and a variation (an inclination) of the cell current Id may increase or may be relatively gentle, as indicated by a dotted line, according to a program state of adjacent cells. That is, when determining data based on the specific sensing reference current iCell, the level of the cell current Id may vary according to the program state of the adjacent cell, resulting in an increase in a dispersion width of a threshold voltage.

As shown in FIG. 6A, when reading cells at a higher temperature, the dispersion width is smaller when determining data with respect to the specific sensing reference current iCell. When reading cells at a lower temperature without increasing the level of the bit line shutoff signal vBLSHF, the level of the cell current Id greatly varies according to the program state of adjacent cells as shown by the dotted line, resulting in a relative increase in the dispersion width of the threshold voltage, which degrades the accuracy of data sensing. Accordingly, to improve the increase in the dispersion width due to the change in the cell current Id according to temperature, it may be advantageous to increase the level of the bit line shutoff signal vBLSHF as the temperature decreases. FIG. 6A shows an example in which the dispersion width of the threshold voltage decreases when the level of the shutoff signal vBLSHF increases.

FIG. 6B shows an example in which the sensing reference current iCell decreases by increasing a time tSODEV of a data sensing period while the level of the bit line shutoff signal BLSHF increases at a lower temperature. As described above, programmed cells have different characteristics of the cell current Id due to the threshold voltage distribution of adjacent cells. As shown in FIG. 6B, when reading data at a lower temperature, the dispersion width of the threshold voltage may decrease when determining data with respect to a smaller sensing reference current iCell compared to the higher temperature. When a specific capacitance value and a voltage Vg are applied to a cell, the cell current Id may decrease over time in terms of the characteristic of the cell, and accordingly, the level of the sensing reference current iCell for determining data may be reduced by increasing the time tSODEV of the data sensing period. That is, to improve a problem caused by the increase in the dispersion width due to a temperature change, it may be advantageous to increase the time tSODEV of the data sensing period and to vary and set the sensing reference current iCell as the temperature decreases.

Figure 7:
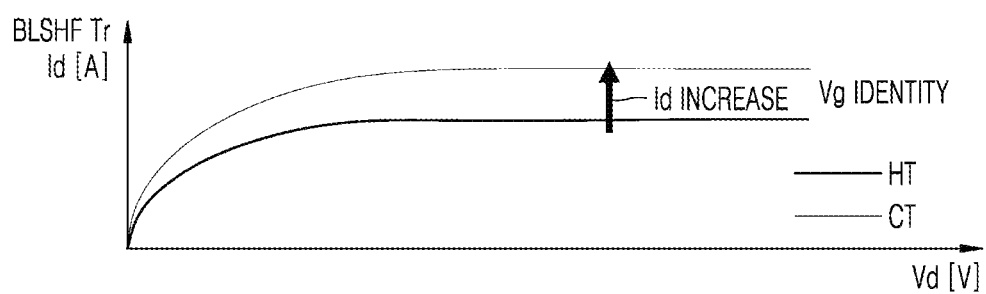
FIG. 7 is a graph showing characteristics of a general shutoff transistor.
Figure 8:
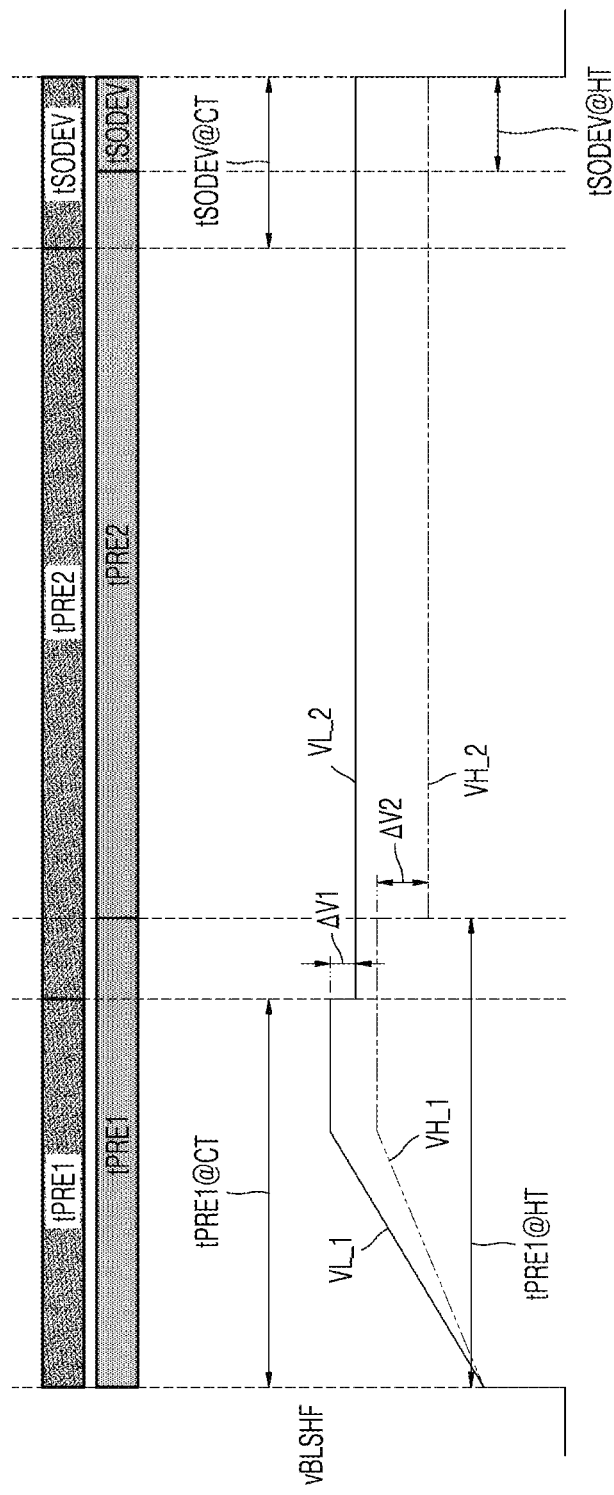
FIG. 8 is a graph showing an example of bit line control in a pre-charge period according to example embodiments of the inventive concepts.

FIG. 7 is a graph showing characteristics of a general shutoff transistor, and FIG. 8 is a graph showing an example of bit line control in a pre-charge period according to example embodiments of the inventive concepts.

Referring to FIGS. 5 to 7, unlike a cell, the shutoff transistor T_SHF may have a characteristic in which a current level increases as the temperature decreases. The period in which the bit line BL is pre-charged may include a first period and a second period, and in the first period and the second period, the shutoff transistor T_SHF may be controlled differently, and in the first period corresponding to an initial period, the bit line BL is overdriven at a higher bias compared to a target level for a certain time, and thus the total time of a pre-charge period may be reduced. In some example embodiments, the shutoff transistor T_SHF operates in a saturation region on a current Id-voltage Vg curve, and in this period, the level of the cell current Id increases as the temperature decreases.

According to the above characteristics, when the bit line BL is pre-charged by setting the vBLSHF offset equally at higher and lower temperatures (or when the BLSHF voltage level greatly increases in the first period at the lower temperature), as the bit line BL is over pre-charged, the dispersion shifts to the right, which results in a characteristic deterioration due to an increase in the dispersion width. In example embodiments of the inventive concepts, temperature compensation may be performed based on the characteristic of a transistor in a page buffer in the first period in which overdrive is performed irrespective of the target level of the bit line BL, and accordingly, a method of reducing or preventing deterioration due to dispersion shift is achieved.

Referring to FIGS. 5 to 8, in FIG. 8, the level of the bit line shutoff signal BLSHF in the pre-charge period and times of the first and second periods are illustrated. In addition, FIG. 8 shows an example of variation of the level of the bit line shutoff signal BLSHF at lower and higher temperatures.

In the following example embodiments, criteria for classifying higher and lower temperatures may be variously set. As an example, various parameter values (e.g., a voltage level, a time interval, etc.) described in the inventive concepts may vary analogously according to a temperature change, and the parameter value may change correspondingly according to the temperature change. Alternatively, according to various example embodiments, a certain reference value related to temperature is set, and when the detected temperature is greater than the reference value, it may be determined as higher temperature, and when it is smaller than the reference value, it may be determined as lower temperature, and the parameter value may vary in comparison with the reference value. As an example, assuming that the normal temperature range of a memory device is −40° C. to 105° C., an arbitrary temperature at which the characteristics of the memory cell (or the characteristics of a read operation) varies greater between −40° C. and 105° C. and an arbitrary temperature range may be set as a reference value, and higher and lower temperatures may be determined according to the reference value.

Alternatively, when two or more reference values are set, the temperature may be determined in at least three ranges, and accordingly, an adjustment operation related to the voltage level and/or time period may be adjusted in a plurality of steps in example embodiments of the inventive concepts. In addition, it may be determined whether the memory device operates at a lower temperature or a higher temperature according to various other criteria, and example embodiments of the inventive concepts are not limited to a specific method in relation to temperature determination.

In the case of a lower temperature CT, in a first period tPRE_1 of the pre-charge period, the bit line shutoff signal BLSHF may increase to a first level VL_1 and then maintain the first level VL_1. Thereafter, as the bit line shutoff signal BLSHF enters a second period tPRE_2 of the pre-charge period, the level of the bit line shutoff signal BLSHF may decrease to a second level VL_2, and the second level VL_2 may be maintained during the second period tPRE_2. In case of lower temperature CT, vBLSHF offsets VL_1-VL_2, ΔV1 may have a first value.

In the case of a higher temperature HT, the bit line shutoff signal BLSHF may increase to a third level VH_1 in the first period tPRE_1 of the pre-charge period and then maintain the third level VH_1. Thereafter, as the bit line shutoff signal BLSHF enters the second period tPRE_2 of the pre-charge period, the level of the bit line shutoff signal BLSHF decreases to a fourth level VH_2, and the fourth level VH_2 may be maintained during the second period tPRE_2. In the case of the higher temperature HT, vBLSHF offsets VH_1-VH_2, ΔV2 may have a second value, and the second value may be greater than the first value.

As illustrated in FIG. 8, when the memory device is at the lower temperature CT, the first period tPRE_1 may be shorter than the first period tPRE_1 when the memory device is at the higher temperature HT. In addition, according to example embodiments, the second period tPRE_2 when the memory device is at the lower temperature CT and the second period tPRE_2 when the memory device is at the higher temperature HT may be the same or substantially the same or similar. Accordingly, the total time of the pre-charge period may be shorter when the memory device is at the lower temperature CT than when the memory device is at the higher temperature HT. In addition, as described above, a data sensing period tSODEV may be set to be longer in the case of the lower temperature CT than in the case of the higher temperature HT. In example embodiments, in the case of the lower temperature CT, the data sensing period tSODEV may be set to be longer, and accordingly, the total time required to read data may be the same or substantially the same as or similar to the case of the lower temperature CT and the higher temperature HT.

According to example embodiments of the inventive concepts as described above, the degree to which the bit line BL is over pre-charged at the lower temperature CT may be reduced, and accordingly, the time of the second period tPRE_2 at the lower temperature CT may be reduced or prevented from excessively increasing. In addition, in example embodiments, the time of the second period tPRE_2 may be set to be the same in the case of the lower temperature CT and the higher temperature HT. Because the necessity for increasing the second period tPRE_2 at the lower temperature CT may be reduced, the second period tPRE_2 may be reduced or prevented from unnecessarily increasing even at the higher temperature HT.

In FIG. 8, an example in which the vBLSHF offset and the time of the first period tPRE_1 are applied together is shown, but example embodiments of the inventive concepts are not limited thereto. For example, in example embodiments, the memory device may be implemented such that only the vBLSHF offset may be adjusted according to a temperature change, or only the time of the first period tPRE_1 may be adjusted according to the temperature change.

Figure 9A:
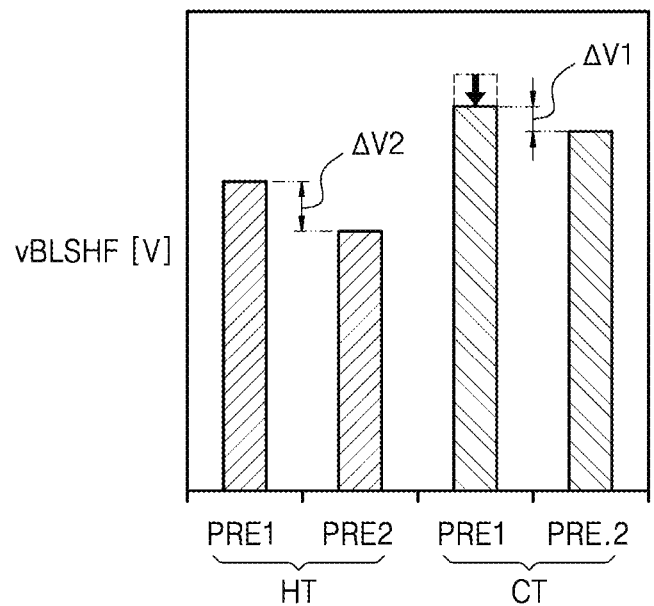
FIGS. 9A and 9B are diagrams illustrating examples of comparing read performance when example embodiments of the inventive concepts are not applied and when example embodiments of the inventive concepts are applied.
Figure 9B:
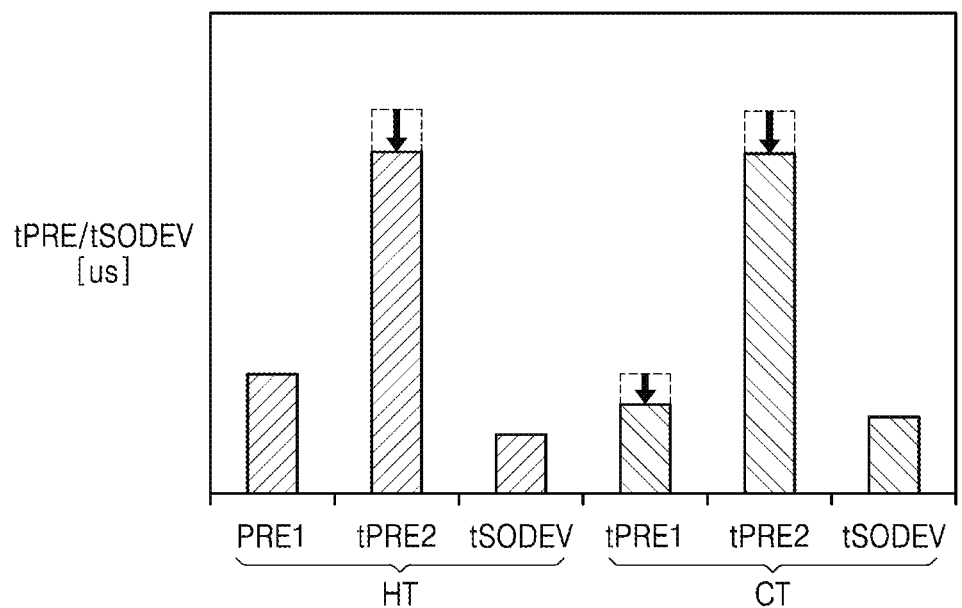

FIGS. 9A and 9B are diagrams illustrating examples of comparing read performance when example embodiments of the inventive concepts are not applied and when example embodiments of the inventive concepts are applied.

In FIG. 9A, the vBLSHF offset is illustrated in the case of the higher temperature HT and the lower temperature CT, and a level of the bit line shutoff signal BLSHF decreases in the first period tPRE_1 of the lower temperature CT compared to the case where example embodiments of the inventive concepts are not applied (shown by the dotted line), and accordingly, a vBLSHF offset ΔV1 at the lower temperature CT may be set to be less than a vBLSHF offset ΔV2 at the higher temperature HT.

In addition, FIG. 9B shows the first period tPRE_1, the second period tPRE_2, and the data sensing period tSODEV in the case of the higher temperature HT and the lower temperature CT. When example embodiments of the inventive concepts are not applied, the first period tPRE_1 in the lower temperature CT and the first period tPRE_1 in the higher temperature HT may have the same time, as shown by the dotted line. According to example embodiments of the inventive concepts, the first period tPRE_1 at the lower temperature CT may be set to be shorter than the first period tPRE_1 at the higher temperature HT. In addition, compared to the case where example embodiments of the inventive concepts are not applied, according to example embodiments of the inventive concepts, the second period tPRE_2 may be set to be shorter in the case of both the lower temperature CT and the higher temperature HT. In addition, in example embodiments, the data sensing period tSODEV may be set to be longer at the lower temperature CT than at the higher temperature HT.

Figure 10:
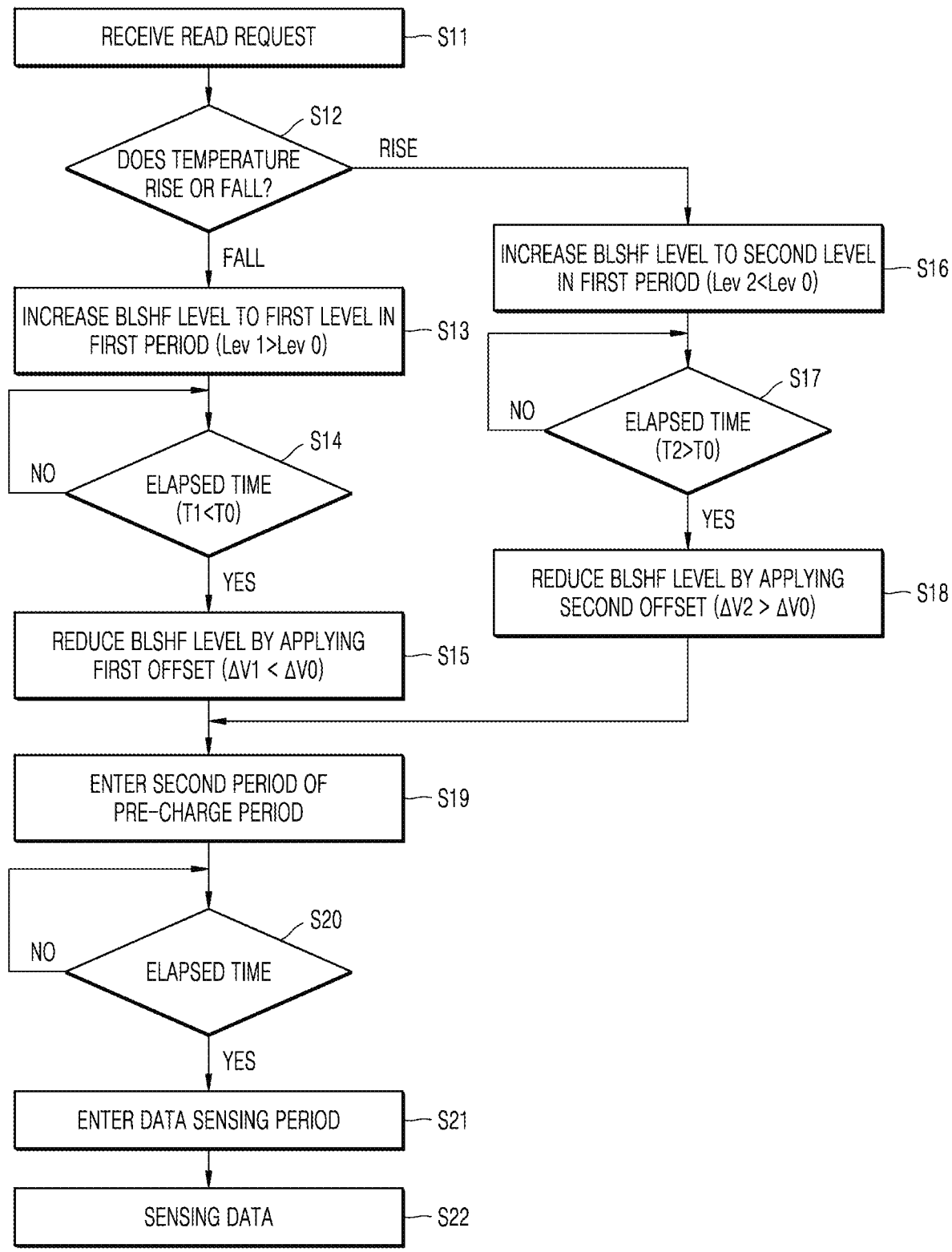
FIG. 10 is a flowchart showing an operating method of a memory device according to example embodiments of the inventive concepts.

FIG. 10 is a flowchart showing an operating method of a memory device according to example embodiments of the inventive concepts.

Referring to FIG. 10, a memory device may perform a data read operation in response to a read request received from a host (or a memory controller) (S11), and according to the above-described example embodiments, a pre-charge period may include a first period in which an initial bit line is overdriven and a second period thereafter.

The memory device may perform the data reading operation according to a previously set state, and may determine whether the temperature has risen or fallen according to an internal temperature sensor or temperature information provided external to, or outside (S12). As a result of the determination, when it is determined that the temperature has fallen, a level of the bit line shutoff signal BLSHF applied to a gate of a transistor (e.g., a shutoff transistor) in a page buffer may increase to and maintain a first level Lev 1 in the first period of a pre-charge period (S13). Otherwise, when it is determined that the temperature has risen, the level of the bit line shutoff signal BLSHF may increase to and maintain a second level Lev 2 in the first period of the pre-charge period (S16). When the level of the bit line shutoff signal BLSHF in a previously set first period is defined as a reference level Lev 0, the first level Lev 1 may be greater than the reference level Lev 0, and the second level Lev 2 may be less than the reference level Lev 0.

The time of the first period may be set differently according to a temperature change, and when the temperature has fallen, it may be determined whether the elapsed time of the first period is equal to or greater than a set first time T1 (S14). When the elapsed time is less than the first time T1, the first period may be maintained, whereas, when the elapsed time of the first period is equal to or more than the set first time T1, the level of the bit line shutoff signal BLSHF may be reduced by applying a first offset ΔV1 (S15). For example, when the time of the previously set first period is defined as the reference time T0, the first time T1 may be shorter than the reference time T0. In addition, when the previously set vBLSHF offset is defined as a reference offset ΔV0, the first offset ΔV1 may be smaller than the reference offset ΔV0.

When the temperature has risen, it may be determined whether the elapsed time of the first period is equal to or greater than the set second time T2 (S17). The second time T2 may be set to be longer than the reference time T0, and when the elapsed time is less than the second time T2, the first period may be maintained, whereas, when the elapsed time of the first period is equal to or more than the set time T2, the level of the bit line shutoff signal BLSHF may be reduced by applying a second offset ΔV2 (S18). In addition, the second offset ΔV2 may be greater than the reference offset ΔV0.

As described above, the level of the bit line shutoff signal BLSHF may be reduced, and the memory device may enter a second period of a pre-charge period (S19). According to example embodiments, the time of the second period may be set to be the same regardless of the temperature change, and accordingly, it may be determined whether the elapsed time of the second period is equal to or greater than a set third time T3 (S20). When the elapsed time is less than the third time T3, the second period may be maintained, whereas, when the elapsed time of the second period is equal to or greater than the set third time T3, the pre-charge operation ends and the data sensing period is entered (S21), and data may be sensed by sensing the level of a node (e.g., a sensing node) connected to the bit line (S22).

In the above example embodiments, an example in which the time of the second period is set to be the same regardless of the temperature change is shown, but example embodiments of the inventive concepts are not limited thereto, and the lower the temperature, the shorter the time of the first period, and thus, when the temperature is lower, the second period may be set to be somewhat longer than at the higher temperature.

Figure 11:
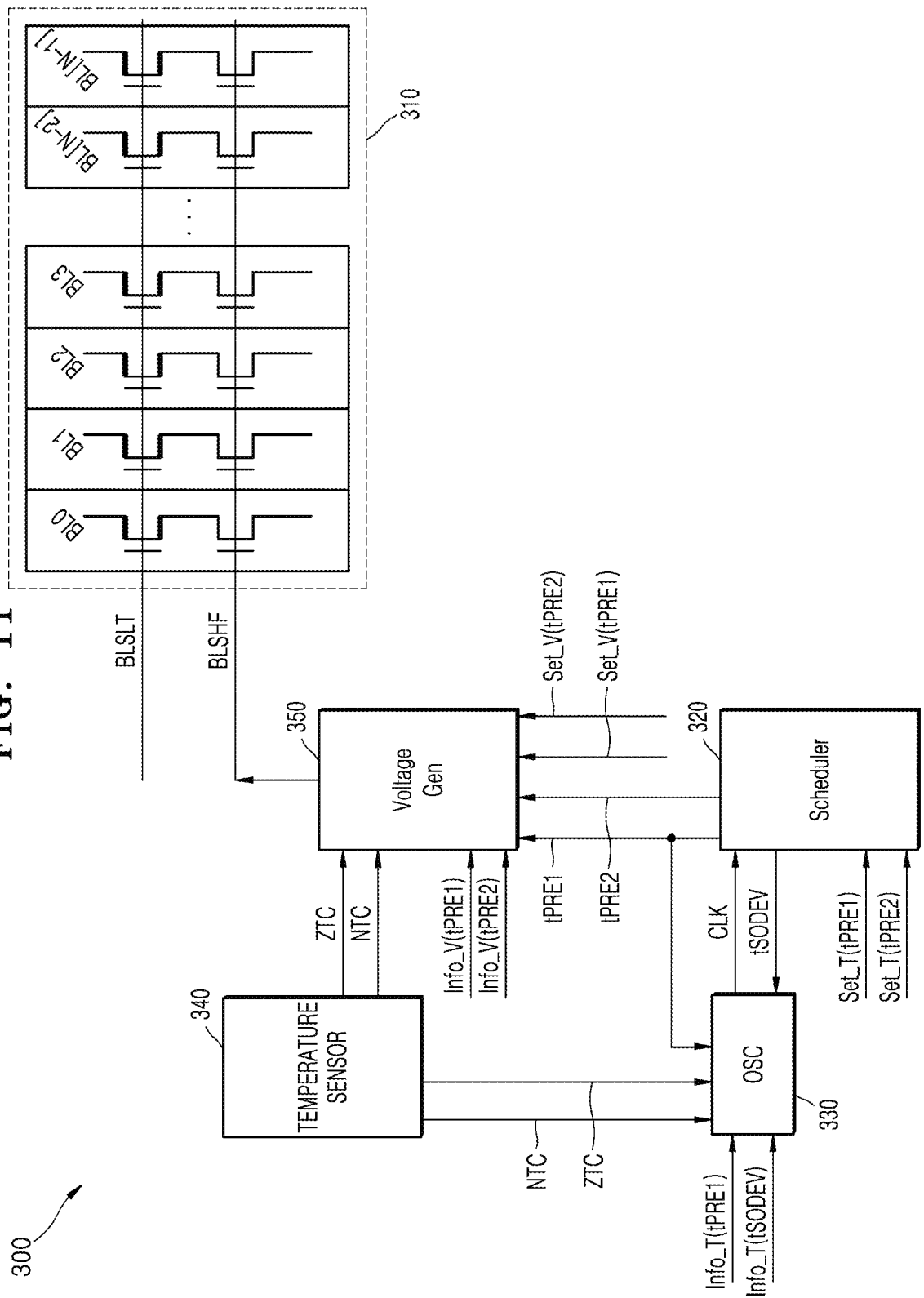
FIG. 11 is a block diagram illustrating an implementation example of a memory device for driving a page buffer according to example embodiments of the inventive concepts.

FIG. 11 is a block diagram illustrating an implementation example of a memory device 300 according to example embodiments of the inventive concepts. Various control information and setting information shown in FIG. 11 are merely an example of implementation, and the memory device 30 may operate according to various other methods in implementing the above-described example embodiments.

Referring to FIG. 11, the memory device 300 may include a page buffer 310 connected to a plurality of bit lines BL0 to BL[N−1], a scheduler 320, a clock generator OSC 330, a temperature sensor 340, and/or a voltage generator 350. According to example embodiments, transistors for receiving a bit line selection signal BLSLT and the bit line shutoff signal BLSHF from the page buffer 310 are briefly illustrated. Further, the scheduler 320 may perform a function of scheduling various operations for data reading, and as an example, may be a component included in a control logic in the above-described example embodiments. Further, the voltage generator 350 may generate the bit line shutoff signal BLSHF, and although not specified in FIG. 11, the bit line selection signal BLSLT may also be generated by the voltage generator 350.

The temperature sensor 340 may generate temperature information ZTC and NTC according to a result of detecting the temperature, the temperature information ZTC may have a constant level regardless of temperature, and the temperature information NTC may be a signal of which the level linearly varies according to the temperature. The scheduler 320 may provide information indicating the first period tPRE1 and the data sensing period tSODEV to the clock generator OSC 330, and the clock generator OSC 330 may vary a period of the clock signal CLK in the first period tPRE1, and may also vary the period of the clock signal CLK in the data sensing period tSODEV. For example, the clock generator OSC 330 may vary the period of the clock signal CLK based on the temperature information ZTC and NTC and period information Info_T(tPRE1) and Info_T (tSODEV). As an implementation example, the period information Info_T(tPRE1) and Info_T(tSODEV)) may include coefficient information indicating an adjustment amount of a period according to a temperature change.

The scheduler 320 may set the first period tPRE1 and the second period tPRE2, and, as an example, may set the first period tPRE1 and the second period tPRE2 based on setting information Set_T(tPRE1) and Set_T(tPRE2) and the clock signal CLK. For example, the setting information Set_T (tPRE1) and Set_T(tPRE2) may respectively include counting information in the first period tPRE1 and the second period tPRE2, and may set periods obtained by counting the clock signal CLK by a certain number of times as the first period tPRE1 and the second period tPRE2. As described above, a cycle of the clock signal CLK may vary in the first period tPRE1 according to the temperature change, and time of the first period tPRE1 may vary according to the temperature change according to the cycle of the clock signal CLK. Although not shown in FIG. 11, the scheduler 320 may further receive setting information related to the data sensing period tSODEV, and may set the time of the data sensing period based on the clock signal CLK and the setting information.

The voltage generator 350 may generate the bit line shutoff signal BLSHF based on various control information, and may vary the level of the bit line shutoff signal BLSHF according to a temperature and a period. As an example, voltage setting information Set_V(tPRE1) and Set_V (tPRE2) may respectively include information for setting the level of the bit line shutoff signal BLSHF in the first period tPRE1 and the second period tPRE2, and voltage adjustment information Info_V(tPRE1) and Info_V(tPRE2) may respectively include coefficient information indicating how much the voltage level is to vary in the first period tPRE1 and the second period tPRE2 according to the temperature change. The voltage generator 350 may adjust a voltage level in each period according to the above-described example embodiments based on the temperature information ZTC and NTC and the voltage adjustment information Info_V(tPRE1) and Info_V(tPRE2) with respect to the bit line shutoff signal BLSHF generated based on the voltage setting information Set_V(tPRE1) and Set_V(tPRE2).

Figure 12:
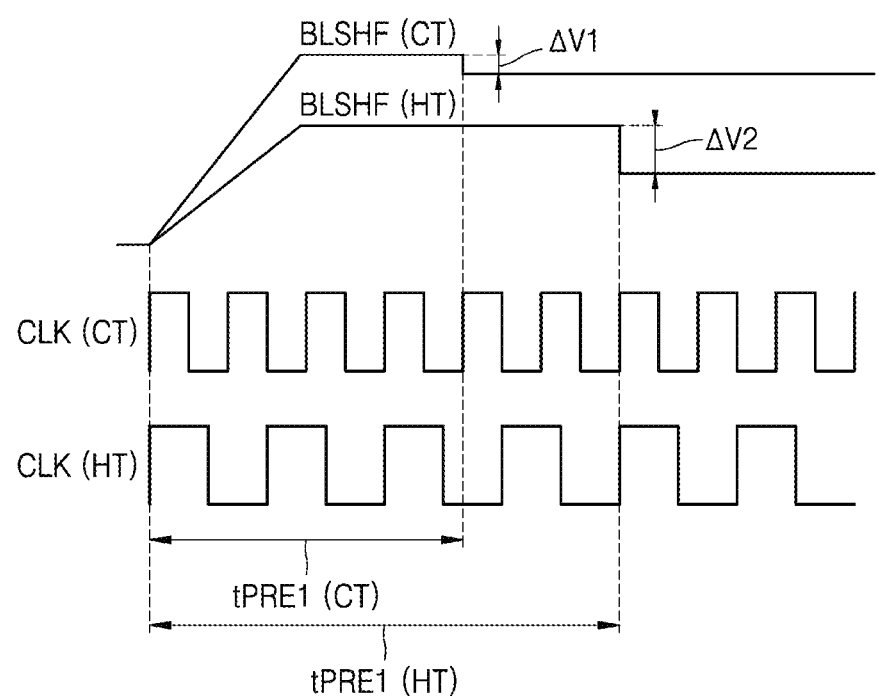
FIG. 12 is a waveform diagram illustrating an example of adjusting a first period and a second period in a pre-charge period.

FIG. 12 is a waveform diagram illustrating an example of adjusting the first period tPRE1 and a second period in a pre-charge period.

Referring to FIG. 12, an example in which a period of the clock signal CLK is set differently at the higher temperature HT and the lower temperature CT is shown, and an example in which the period of clock signal CLK is set shorter at the lower temperature CT is shown. The scheduler 320 may set the first period tPRE1 according to a certain counting value, and an example in which because a period of the clock signal CLK is shorter at the lower temperature CT, the first period tPRE1 is shorter at the lower temperature CT is shown. In addition, according to the operation of the voltage generator 350, the bit line shutoff signal BLSHF may be generated such that the vBLSHF offset ΔV1 at the lower temperature CT is smaller than the vBLSHF offset ΔV2 at the higher temperature HT.

Figure 13:
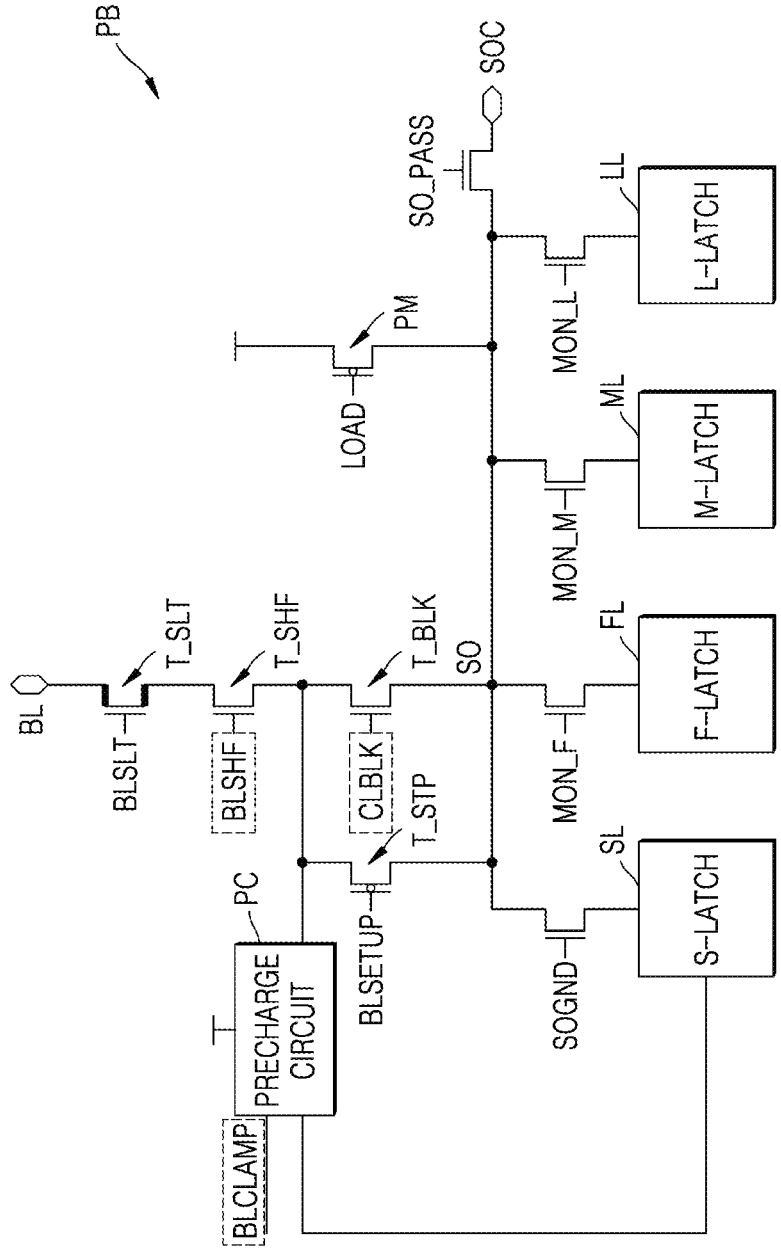
FIG. 13 is a circuit diagram illustrating a specific implementation example of a page buffer according to example embodiments of the inventive concepts.
Figure 14:
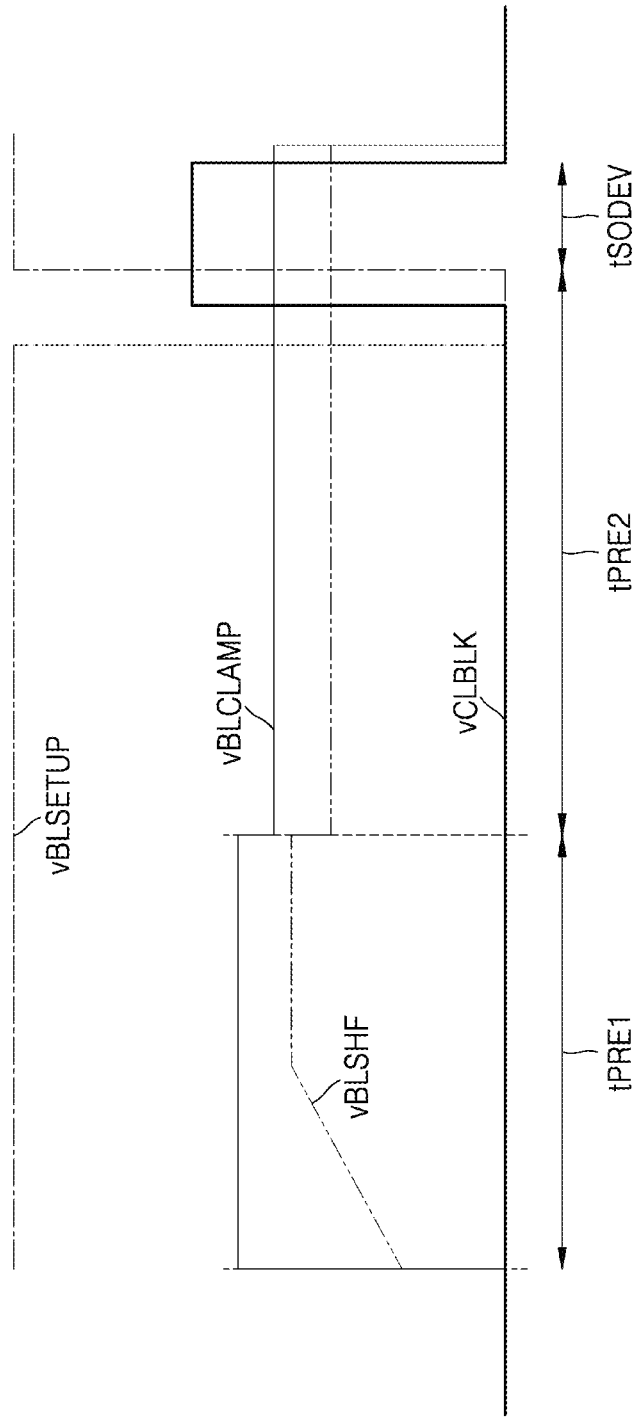
FIG. 14 is a diagram illustrating an example of waveforms of various control signals provided to the page buffer shown in FIG. 13.

FIG. 13 is a circuit diagram illustrating a specific implementation example of the page buffer PB according to example embodiments of the inventive concepts, and FIG. 14 is a diagram illustrating an example of waveforms of various control signals provided to the page buffer PB shown in FIG. 13.

In FIG. 13, a data latch unit of the page buffer PB is shown. As an example, the page buffer PB may include a bit line selection transistor T_SLT connected to the bit line BL and is driven by the bit line selection signal BLSLT. The bit line selection transistor T_SLT may be implemented as a higher voltage transistor.

The page buffer PB may further include one or more latches that are a sensing latch SL, a force latch FL, an upper bit latch ML, and/or a lower bit latch LL connected to the sensing node SO, and may further include transistors disposed between the sensing node SO and the latches to operate in response to various control signals SOGND, MON_F, MON_M, and MON L. In addition, the page buffer PB may further include a pre-charge circuit PC capable of controlling a pre-charge operation on the bit line BL or the sensing node SO based on a bit line clamping control signal BLCLAMP and may further include a setup transistor T_STP driven by a bit line setup signal BLSETUP. The latches may store various types of information. As an example, the sensing latch SL may store data stored in a memory cell or a sensing result of a threshold voltage of the memory cell during a read or program verify operation. In addition, the force latch FL may be used to improve threshold voltage dispersion during a program operation. In addition, the upper bit latch ML, the lower bit latch LL, and a cache latch (not shown) may be used to store data input external to, or from outside during the program operation.

The page buffer PB may further include one or more other transistors. As an example, the page buffer PB may further include a bit line shutoff transistor T_SHF and a bit line connection control transistor T_BLK connected in series between the bit line selection transistor T_SLT and the sensing node SO. Also, the page buffer PB may further include a pre-charge transistor PM driven by a load signal LOAD. In addition, in example embodiments, the page buffer PB may further include a transistor that controls a connection to a cache latch node SOC of the cache latch unit in response to a path control signal SO_PASS.

An example of an operation of the page buffer PB shown in FIG. 13 will be described with reference to FIG. 14 as follows.

The level of the signal for controlling one or more transistors provided in the page buffer PB may be adjusted according to a temperature change by applying example embodiments of the inventive concepts. For example, as shown in FIG. 13, the bit line shutoff signal BLSHF has a certain offset in the first period tPRE1 and the second period tPRE2 and may have a varying level. The lower the temperature, the smaller the offset of the bit line shutoff signal BLSHF may be set.

In the pre-charge periods tPRE1 and tPRE2 and the data sensing period tSODEV, the bit line setup signal BLSETUP and the bit line connection control signal CLBLK may have the waveforms shown in FIG. 14, and the setup transistor T_STP may be turned on for some periods immediately before the data sensing period tSODEV starts, and the bit line connection control transistor T_BLK may be turned on. Also, as the setup transistor T_STP is turned off again, the data sensing period tSODEV may start.

In the example shown in FIG. 14, in addition to the above-described bit line shutoff signal BLSHF, temperature compensation according to example embodiments of the inventive concepts may also be applied to a bit line clamping control signal BLCLAMP and a bit line connection control signal CLBLK as at least one other signal. For example, as shown in FIG. 14, the levels of the signals may have a relationship of vBLSHF≤vBLCLAMP≤vCLBLK, and as temperature compensation is applied, the bit line clamping control signal BLCLAMP and the bit line connection control signal CLBLK may have different levels according to the temperature. In addition, a compensation amount may be differently adjusted according to the temperature change, and as an example, an offset and times of the first period tPRE1 and the second period tPRE2 may be differently adjusted on each of the bit line clamping control signal BLCLAMP and the bit line connection control signal CLBLK according to the temperature change.

In the pre-charge operation, the level of the bit line clamping control signal BLCLAMP may remain constant. Alternatively, as shown in FIG. 14, the level of the bit line clamping control signal BLCLAMP may also have a certain offset in the first period tPRE1 and the second period tPRE2, and as example embodiments of the inventive concepts are applied, the lower the temperature, the smaller the offset of the bit line clamping control signal BLCLAMP may be set.

Figure 15:
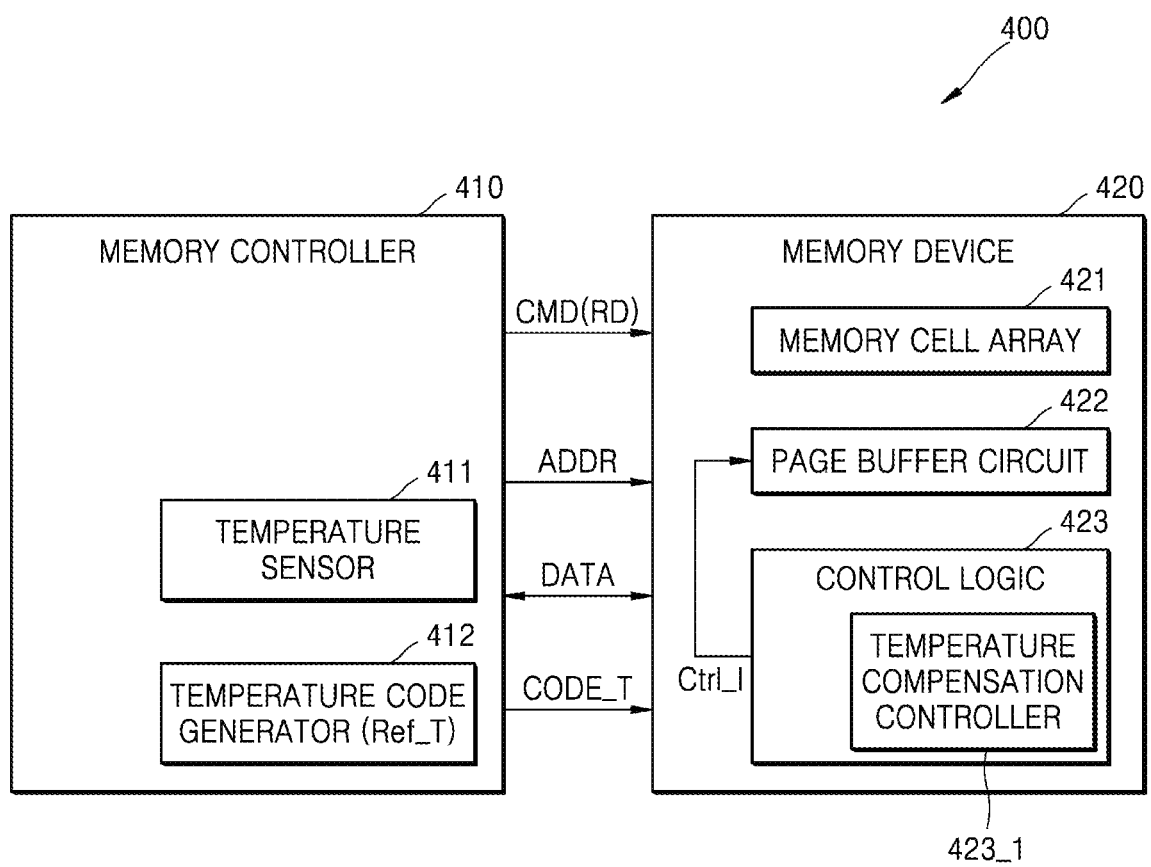
FIG. 15 is a diagram illustrating an example of a memory device and an operation thereof according to example embodiments of the inventive concepts.

FIG. 15 is a diagram illustrating an example of a memory device 420 and an operation thereof according to example embodiments of the inventive concepts. FIG. 15 illustrates an example in which temperature detection is performed external to, or outside the memory device 420.

Referring to FIG. 15, a memory system 400 may include a memory controller 410 and the memory device 420, and the memory device 420 may be the memory device described in the above-described example embodiments. The memory controller 410 may include a temperature sensor 411 and/or a temperature code generator 412, and the memory device 420 may include a memory cell array 421, a page buffer circuit 422 and/or a control logic 423. In addition, the control logic 423 may include a temperature compensation controller 423_1, and the command CMD, the address ADDR, and the data DATA may be transmitted and received between the memory controller 410 and the memory device 420. In addition, the memory controller 410 may provide a read command RD as an example of the command CMD to the memory device 420, and the memory device 420 may read the data DATA based on a pre-charge operation and a data sensing operation according to the above-described example embodiments.

The temperature sensor 411 in the memory controller 410 may detect the temperature and convert the temperature into a digital code to provide temperature code information CODE_T to the memory device 420. According to example embodiments, the temperature code generator 412 may generate and provide the temperature code information CODE_T when the temperature varies more than a certain standard, and may include reference information Ref T in this regard. For example, when a difference in the temperature corresponding to the previously provided temperature code information CODE_T and the currently detected temperature is greater than or equal to the reference information Ref T, the temperature code information CODE_T may be provided to the memory device 420. The control logic 423 may generate an internal control signal Ctrl_I based on various types of information set in the temperature compensation controller 423_1 and the temperature code information CODE_T and provide the internal control signal Ctrl_I to the page buffer circuit 422.

According to example embodiments, because the pre-charge operation and the data sensing operation are performed in a data reading process, the memory controller 410 may also provide the temperature code information CODE_T to the memory device 420 when providing the read command RD.

According to example embodiments as described above, a temperature sensor and a bias variable circuit corresponding thereto may be removed from the memory device 420, and accordingly, an effect of reducing the area of a peripheral circuit of the memory device 420 may be expected.

Figure 16:
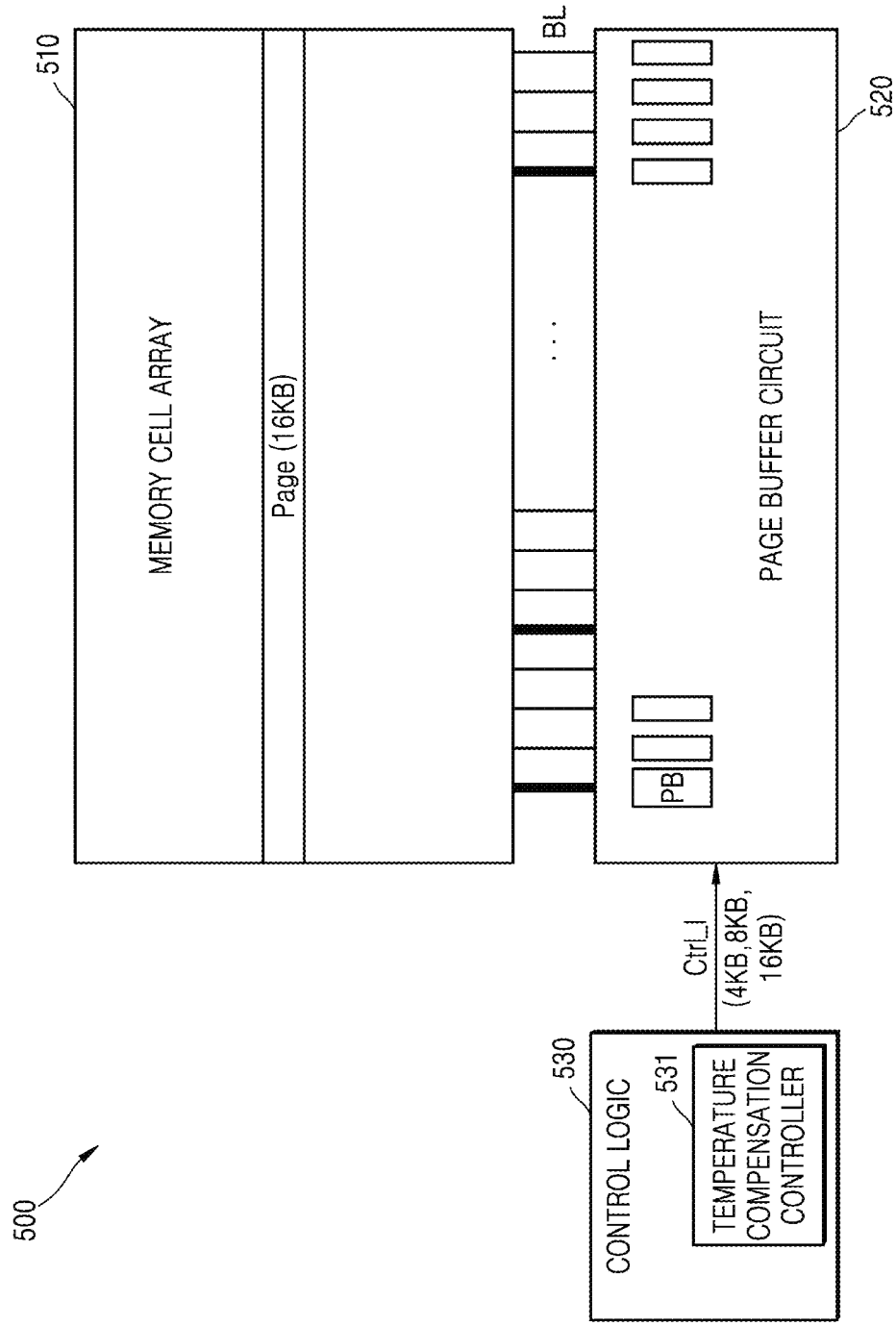
FIGS. 16 and 17 are diagrams illustrating an example of a memory device and an operation thereof according to example embodiments of the inventive concepts.
Figure 17:
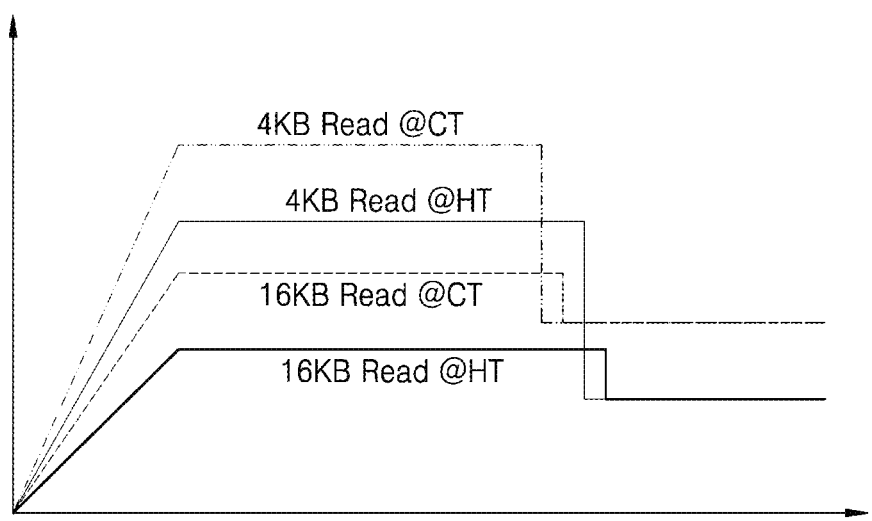

FIGS. 16 and 17 are diagrams illustrating an example of a memory device 500 and an operation thereof according to example embodiments of the inventive concepts. In FIGS. 16 and 17, an example of temperature compensation according to a data read mode is described.

The memory device 500 may include a memory cell array 510, a page buffer circuit 520, and/or a control logic 530, and the control logic 530 may include a temperature compensation controller 531. According to an implementation example, the memory cell array 510 may include memory cells corresponding to a page size of 16 KB, and perform in various modes such as a 16 KB read mode, an 8 KB read mode, and a 4 KB read mode according to a read mode. When the memory device 500 operates in the 4 KB read mode, one of the four adjacent bit lines BL may be selected and data may be read. The control logic 530 may read data according to the selected read mode and may provide the internal control signal Ctrl_I for the read operation described in the above-described example embodiments to the page buffer circuit 520.

In the case of the 4 KB read mode or the 8 KB read mode, one or more adjacent bit lines BL are in a ground state, whereas in the 16 KB read mode, the adjacent bit lines BL are simultaneously pre-charged, and thus an amount of bit line BL coupling varies according to the biasing level of the adjacent bit line BL, and the time required for pre-charge may vary. Accordingly, the level of the bit line shutoff signal BLSHF may be differently controlled in first and second period based on the read mode, and according to example embodiments of the inventive concepts, temperature compensation on the bit line shutoff signal BLSHF may be applied to each read mode. In addition, according to example embodiments of the inventive concepts, a control operation may be performed such that temperature compensation is applied differently for each read mode. As an example, temperature compensation in the 16 KB read mode and the 4 KB read mode and temperature compensation in the 8 KB read mode may be applied differently.

FIG. 17 shows an example of an operation of the memory device 500 shown in FIG. 16. In FIG. 17, for convenience of description, only the 4 KB read mode and the 16 KB read mode are illustrated, and the amount of compensation applied to the 8 KB read mode may have a value between the amount of compensation in the 4 KB read mode and the amount of compensation in the 16 KB read mode.

Referring to FIG. 17, in the 4 KB read mode, a capacitance value due to the adjacent bit line BL in the ground state increases, and an overdrive amount may be set to be greater than in other read modes. Accordingly, in the case of the same temperature (e.g., assuming that it is the higher temperature HT), in the case of the 4 KB read mode in the first period, the level of the bit line shutoff signal vBLSHF increases significantly, whereas in the case of the 16 KB read mode, the level of the bit line shutoff signal vBLSHF may increase less. In addition, when the temperature is the same, the level of the bit line shutoff signal vBLSHF in the second period may decrease to the same value in the 4 KB read mode and the 16 KB read mode. Accordingly, the vBLSHF offset in the 4 KB read mode may be set to be greater than that in the 16 KB read mode. In addition, in example embodiments, an example in which the first period in the 4 KB read mode is set to be shorter than the first period in the 16 KB read mode is illustrated, but example embodiments of the inventive concepts do not need to be limited thereto, and the first period may be set to be to have the same time with respect to the read modes.

Temperature compensation may be applied with respect to various read modes according to example embodiments of the inventive concepts. As an example, in the case of the 16 KB read mode, as the temperature decreases, the level of the bit line shutoff signal vBLSHF in the first period increases significantly compared to the higher temperature, and the level of the bit line shutoff signal vBLSHF in the second period may be reduced according to a certain vBLSHF offset. In some example embodiments, the vBLSHF offset in the case of the lower temperature may be smaller than that in the case of the higher temperature, and the first period in the case of the lower temperature may be set to be shorter than the first period in case of the higher temperature.

Also, in the case of the 4 KB read mode, similarly to the above, the vBLSHF offset in the case of the lower temperature may be set to be smaller than in case of the higher temperature, and the first period in the case of the lower temperature may be set to be shorter than the first period in case of the higher temperature.

As example embodiments of the inventive concepts may be applied in each of the 4 KB read mode, the 8 KB read mode, and the 16 KB read mode, temperature compensation may be performed such that the vBLSHF offset at the lower temperature is less than the vBLSHF offset at the higher temperature in each mode. In addition, the vBLSHF offset in the read mode having a smaller size at an arbitrary temperature may be set to be greater than the vBLSHF offset in the read mode having a larger size, as an example, as shown in FIG. 17, the vBLSHF offset in the 4 KB read mode may be set to be greater than the vBLSHF offset in the 16 KB read mode at the same temperature.

A bit line biasing level in the 16 KB read mode may vary according to the magnitude relationship between the selected word line bias and the threshold voltage of the cell connected to the bit line BL. According to example embodiments, the time of the first period tPRE1 and the amount of temperature compensation on the vBLSHF offset may be differently set according to the selected word line bias.

Figure 18:
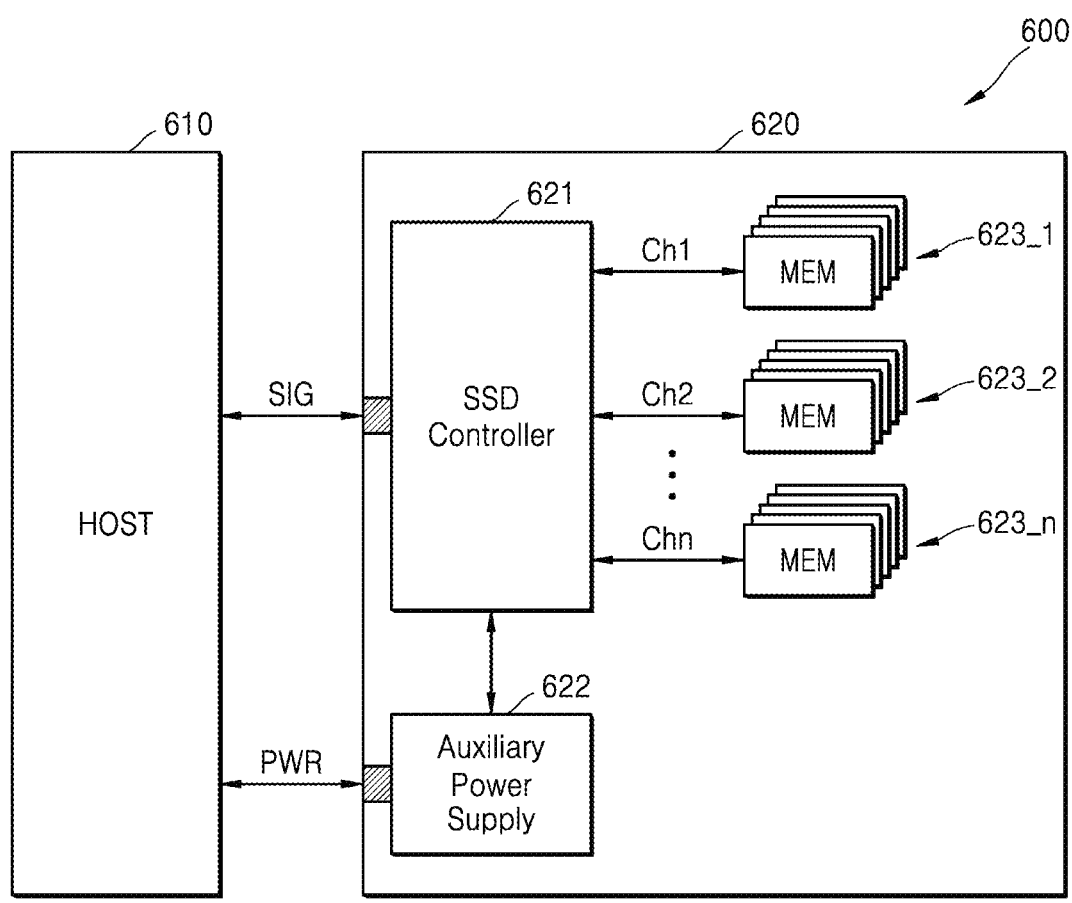
FIG. 18 is a block diagram illustrating an example in which a memory device according to example embodiments of the inventive concepts is applied to an SSD system.

FIG. 18 is a block diagram illustrating an example in which a memory device according to example embodiments of the inventive concepts is applied to an SSD system 600.

Referring to FIG. 18, the SSD system 600 may include a host 610 and/or an SSD 620. The SSD 620 exchanges signals with the host 610 through a signal connector, and receives power through a power connector. The SSD 620 may include an SSD controller 621, an auxiliary power supply 622, and/or memory devices 623_1 to 623_n. The memory devices 623_1 to 623_n may be vertically stacked NAND flash memory devices. In some example embodiments, the SSD 620 may be implemented using example embodiments described above with reference to FIGS. 1 to 17. That is, each of the memory devices 623_1 to 623_n provided in the SSD 620 may set first and second periods in a pre-charge period and apply temperature compensation on various factors such as the vBLSHF offset.

Figure 19:
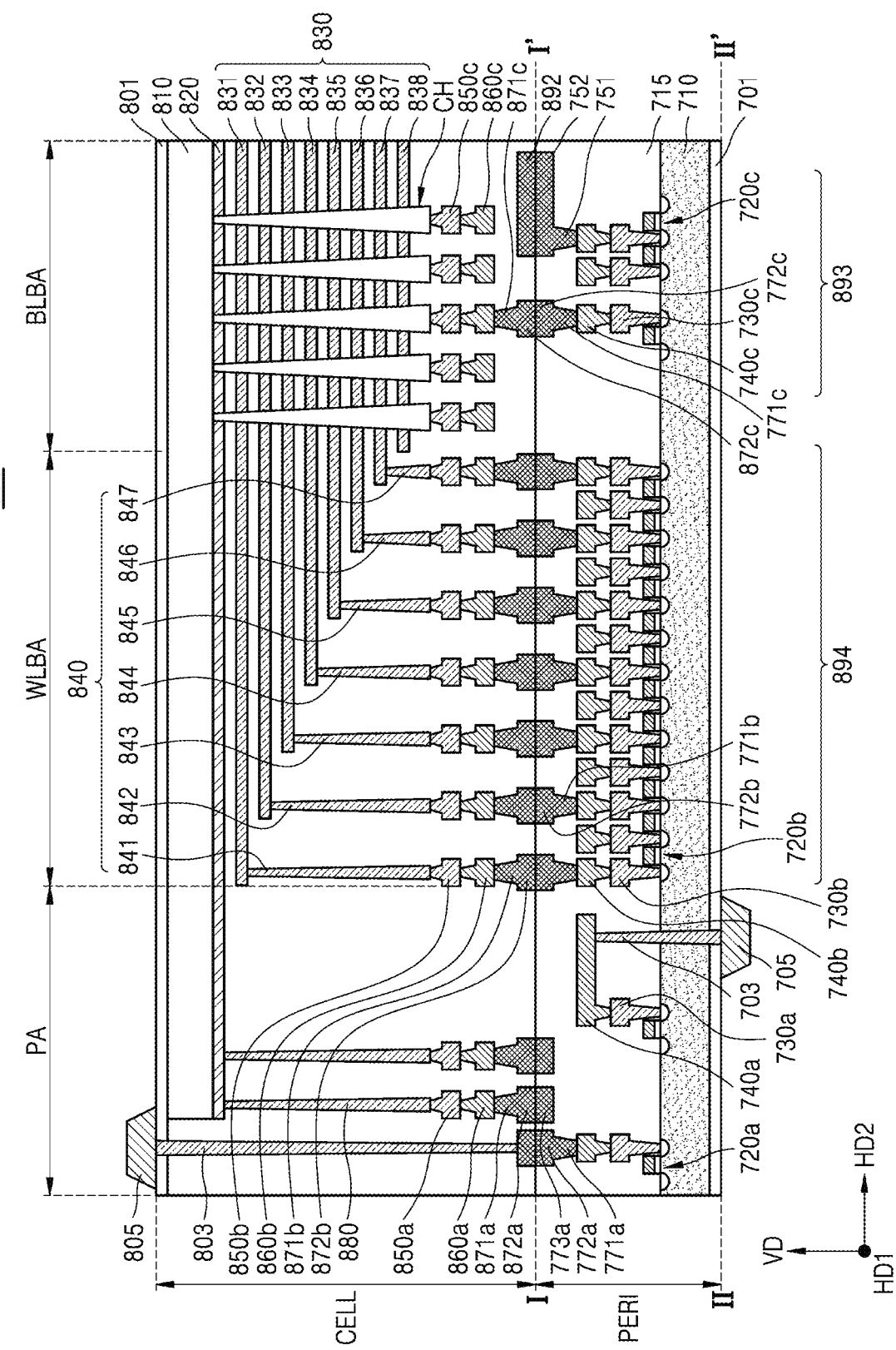
FIG. 19 is a cross-sectional view illustrating a memory device according to example embodiments of the inventive concepts.

FIG. 19 is a cross-sectional view illustrating a memory device 900 according to example embodiments of the inventive concepts.

Referring to FIG. 19, the memory device 900 may have a chip to chip (C2C) structure. The C2C structure may mean that an upper chip including a cell area CELL is fabricated on a first wafer, a lower chip including a peripheral circuit area PERI is fabricated on a second wafer different from the first wafer, and then the upper chip and the lower chip are connected to each other by a bonding method. For example, the bonding method may mean a method of electrically connecting a bonding metal formed on an uppermost metal layer of an upper chip and a bonding metal formed on an uppermost metal layer of a lower chip. For example, when the bonding metal includes copper (Cu), the bonding method may be a Cu—Cu bonding method, and the bonding metal may also include aluminum or tungsten. The example embodiments illustrated in FIGS. 1 to 18 may be implemented in the memory device 900. For example, the page buffer circuit described above with reference to FIGS. 1 to 18 may be disposed in the peripheral circuit area PERI.

Each of the peripheral circuit area PERI and the cell area CELL of the memory device 900 may include an external pad bonding area PA, a word line bonding area WLBA, and a bit line bonding area BLBA. The peripheral circuit area PERI may include a first substrate 710, an interlayer insulating layer 715, a plurality of circuit elements 720*a*, 720*b*, and 720*c* formed on the first substrate 710, first metal layers 730*a*, 730*b*, and 730*c* respectively connected to the plurality of circuit elements 720*a*, 720*b*, and 720*c*, and second metal layers 740*a*, 740*b*, and 740*c* respectively formed on the first metal layers 730*a*, 730*b*, and 730*c*. In example embodiments, the first metal layers 730*a*, 730*b*, and 730*c* may include tungsten having a higher resistance, and the second metal layers 740*a*, 740*b*, and 740*c* may include copper having a lower resistance.

In the present specification, although the first metal layers 730*a*, 730*b*, and 730*c* and the second metal layers 740*a*, 740*b*, and 740*c* are shown and described, they are not limited thereto, and at least one or more metal layers may be further formed on the second metal layers 740*a*, 740*b*, and 740*c*. At least some of the one or more metal layers formed on the second metal layers 740*a*, 740*b*, and 740*c* may include aluminum or the like having a lower resistance than those of copper forming the second metal layers 740*a*, 740*b*, and 740*c*.

The interlayer insulating layer 715 may be disposed on a first substrate 710 and cover the plurality of circuit elements 720*a*, 720*b*, and 720*c*, the first metal layers 730*a*, 730*b*, and 730*c*, and the second metal layers 740*a*, 740*b*, and 740*c*. The interlayer insulating layer 715 may include an insulating material such as silicon oxide, silicon nitride, or the like.

Lower bonding metals 771*b* and 772*b* may be formed on the second metal layer 740*b* of the word line bonding area WLBA. In the word line bonding area WLBA, the lower bonding metals 771*b* and 772*b* of the peripheral circuit area PERI may be electrically connected to upper bonding metals 871*b* and 872*b* of the cell area CELL by the bonding method, and the lower bonding metals 771*b* and 772*b* and the upper bonding metals 871*b* and 872*b* may include aluminum, copper, or tungsten. The upper bonding metals 871*b* and 872*b* in the cell area CELL may be referred as first metal pads and the lower bonding metals 771*b* and 772*b* in the peripheral circuit area PERI may be referred as second metal pads.

The cell area CELL may include at least one memory block. The cell area CELL may include a second substrate 810 and a common source line 820. On the second substrate 810, a plurality of word lines 831 to 838 (e.g., 830) may be stacked in a direction (a Z-axis direction), perpendicular to an upper surface of the second substrate 810. A string selection line and a ground selection line may be arranged on upper and lower portions of the plurality of word lines 830, respectively, and the plurality of word lines 830 may be disposed between the string selection line and the ground selection line.

In the bit line bonding area BLBA, a channel structure CH may extend in a direction, perpendicular to the upper surface of the second substrate 810, and pass through the plurality of word lines 830, the string selection line and the ground selection line. The channel structure CH may include a data storage layer, a channel layer, a buried insulating layer, and/or the like, and the channel layer may be electrically connected to a first metal layer 850*c* and a second metal layer 860*c*. For example, the first metal layer 850*c* may be a bit line contact, and the second metal layer 860*c* may be a bit line. In example embodiments, the bit line may extend in a first horizontal direction HD1 parallel to the upper surface of the second substrate 810.

In example embodiments illustrated in FIG. 19, an area in which the channel structure CH, the bit line, and/or the like are disposed may be defined as the bit line bonding area BLBA. In the bit line bonding area BLBA, the bit line may be electrically connected to the circuit elements 720*c* providing a page buffer 893 in the peripheral circuit area PERI. For example, in the peripheral circuit area PERI, the bit line may be connected to upper bonding metals 871*c* and 872*c*, and the upper bonding metals 871*c* and 872*c* may be connected to lower bonding metals 771*c* and 772*c* connected to the circuit elements 720*c* of the page buffer 893. In example embodiments of the inventive concepts, the circuit elements 720*c* providing the page buffer 893 may include at least one transistor related to a pre-charge operation and data sensing, and the at least one transistor may include a shut off transistor, and the bit line shutoff signal BLSHF provided to the shutoff transistor may have the vBLSHF offset according to the above-described example embodiments. Also, based on the control of the circuit elements 720*c* included in the page buffer 893, the pre-charge operation may be performed on the bit line through the upper bonding metals 871*c* and 872*c* and/or the lower bonding metals 771*c* and 772*c*, and in the case of the lower temperature, the vBLSHF offset corresponding to a difference between the level of the bit line shutoff signal BLSHF in a first period and the level of the bit line shutoff signal BLSHF in the second period may be set to be smaller than in the case of the higher temperature such that the degree to which the bit line is over pre-charged in the above-described first period may be reduced.

In the word line bonding area WLBA, the word lines 830 may extend in a second horizontal direction HD2 parallel to the upper surface of the second substrate 810, and may be connected to a plurality of cell contact plugs 841-847; 840. The word lines 830 and the cell contact plugs 840 may be connected to each other in pads provided by at least some of the word lines 830 extending in different lengths in a second horizontal direction HD2. A first metal layer 850*b* and a second metal layer 860*b* may be sequentially connected to upper portions of the cell contact plugs 840 connected to the word lines 830. The cell contact plugs 840 may be connected to the circuit area PERI through the upper bonding metals 871*b* and 872*b* of the cell area CELL and the lower bonding metals 771*b* and 772*b* of the peripheral circuit area PERI in the word line bonding area WLBA.

The cell contact plugs 840 may be electrically connected to the circuit elements 720*b* providing a row decoder 894 in the peripheral circuit area PERI. In example embodiments, operating voltages of the circuit elements 720*b* providing the row decoder 894 may be different than operating voltages of the circuit elements 720*c* providing the page buffer 893. For example, the operating voltages of the circuit elements 720*c* providing the page buffer 893 may be greater than the operating voltages of the circuit elements 720*b* providing the row decoder 894.

A common source line contact plug 880 may be disposed in the external pad bonding area PA. The common source line contact plug 880 may include a conductive material such as a metal, a metal compound, polysilicon, or the like, and may be electrically connected to the common source line 820. A first metal layer 850a and a second metal layer 860a may be sequentially stacked on an upper portion of the common source line contact plug 880. For example, an area in which the common source line contact plug 880, the first metal layer 850a, and the second metal layer 860a are disposed may be defined as the external pad bonding area PA.

Input-output pads 705 and 805 may be disposed in the external pad bonding area PA. Referring to FIG. 19, a lower insulating film 701 covering a lower surface of the first substrate 710 may be formed on a lower portion of the first substrate 710, and a first input-output pad 705 may be formed on the lower insulating film 701. The first input-output pad 705 may be connected to at least one of the plurality of circuit elements 720a, 720b, and 720c disposed in the peripheral circuit area PERI through a first input-output contact plug 703, and may be separated from the first substrate 710 by the lower insulating film 701. In addition, a side insulating film may be disposed between the first input-output contact plug 703 and the first substrate 710 to electrically separate the first input-output contact plug 703 and the first substrate 710.

Referring to FIG. 19, an upper insulating film 801 covering the upper surface of the second substrate 810 may be formed on the second substrate 810, and a second input-output pad 805 may be disposed on the upper insulating layer 801. The second input-output pad 805 may be connected to at least one of the plurality of circuit elements 720a, 720b, and 720c disposed in the peripheral circuit area PERI through a second input-output contact plug 803.

According to example embodiments, the second substrate 810 and the common source line 820 may not be disposed in a region in which the second input-output contact plug 803 is disposed. Also, the second input-output pad 805 may not overlap the word lines 830 in a third direction (Z-axis direction). Referring to FIG. 19, the second input-output contact plug 803 may be separated from the second substrate 810 in a direction parallel to the upper surface of the second substrate 810, and may pass through the interlayer insulating layer 815 of the cell area CELL to be connected to the second input-output pad 805.

According to example embodiments, the first input-output pad 705 and the second input-output pad 805 may be selectively formed. For example, the memory device 900 may include only the first input-output pad 705 disposed on the first substrate 710 or the second input-output pad 805 disposed on the second substrate 810. Alternatively, the memory device 900 may include both the first input-output pad 705 and the second input-output pad 805.

A metal pattern in an uppermost metal layer may be provided as a dummy pattern or the uppermost metal layer may be absent, in each of the external pad bonding area PA and the bit line bonding area BLBA respectively included in the cell area CELL and the peripheral circuit area PERI.

In the external pad bonding area PA, the memory device 900 may include a lower metal pattern 773a, corresponding to an upper metal pattern 872a formed in an uppermost metal layer of the cell area CELL, and having the same shape as the upper metal pattern 872a of the cell area CELL, in an uppermost metal layer of the peripheral circuit area PERI. In the peripheral circuit area PERI, the lower metal pattern 773a formed in the uppermost metal layer of the peripheral circuit area PERI may not be connected to a contact. Similarly, in the external pad bonding area PA, an upper metal pattern, corresponding to the lower metal pattern formed in an uppermost metal layer of the peripheral circuit area PERI, and having the same shape as a lower metal pattern of the peripheral circuit area PERI, may be formed in an uppermost metal layer of the cell area CELL.

The lower bonding metals 771b and 772b may be formed on the second metal layer 740b in the word line bonding area WLBA. In the word line bonding area WLBA, the lower bonding metals 771b and 772b of the peripheral circuit area PERI may be electrically connected to the upper bonding metals 871b and 872b of the cell area CELL by a bonding method.

Further, the bit line bonding area BLBA, an upper metal pattern 892, corresponding to a lower metal pattern 752 formed in the uppermost metal layer of the peripheral circuit area PERI, and having the same shape as the lower metal pattern 752 of the peripheral circuit area PERI, may be formed in an uppermost metal layer of the cell area CELL. A contact may not be formed on the upper metal pattern 892 formed in the uppermost metal layer of the cell area CELL.

One or more of the elements disclosed above may include or be implemented in one or more processing circuitries such as hardware including logic circuits; a hardware/software combination such as a processor executing software; or a combination thereof. For example, the processing circuitry more specifically may include, but is not limited to, a central processing unit (CPU), an arithmetic logic unit (ALU), a digital signal processor, a microcomputer, a field programmable gate array (FPGA), a System-on-Chip (SoC), a programmable logic unit, a microprocessor, application-specific integrated circuit (ASIC), etc.

While the inventive concepts have been particularly shown and described with reference to example embodiments thereof, it will be understood that various changes in form and details may be made therein without departing from the spirit and scope of the following claims.

What is claimed is:

1. A memory device comprising:
   a memory cell array comprising a plurality of memory cells;
   a page buffer circuit connected to the memory cell array through a plurality of bit lines, comprising a page buffer connected to each of the plurality of bit lines, and configured to perform a pre-charge operation on the plurality of bit lines during a pre-charge period for data reading; and
   a control logic configured to differently control the pre-charge operation of the page buffer circuit according to a detected temperature,
   wherein
      the pre-charge period comprises a first period in which the plurality of bit lines are overdriven and a second period in which the plurality of bit lines are driven at a voltage lower than that of the first period, and
      the first period is set to have a first length in response to the detected temperature being a first temperature, the first period being set to have a second length in response to the detected temperature being a second temperature higher than the first temperature, and the first length being shorter than the second length.

2. The memory device of claim 1, wherein the page buffer comprises a shutoff transistor configured to control an electrical connection between a sensing node and each bit line, wherein a bit line shutoff signal is provided to a gate of the shutoff transistor, wherein, at the first temperature, the bit line shutoff signal rises to a first level in the first period, and at the second temperature, the bit line shutoff signal rises to a second level in the first period, and wherein the first level is higher than the second level.

3. The memory device of claim 2, wherein, at the first temperature, the bit line shutoff signal falls to a third level in the second period, and at the second temperature, the bit line shutoff signal falls to a fourth level in the second period, and wherein a first offset corresponding to a difference between the first level and the third level is smaller than a second offset corresponding to a difference between the second level and the fourth level.

4. The memory device of claim 1, wherein the second period at the first temperature has a same length as the second period at the second temperature.

5. The memory device of claim 1, wherein a data sensing period is performed after the pre-charge period, and wherein the data sensing period at the first temperature is set to be longer than the data sensing period at the second temperature.

6. The memory device of claim 1, wherein temperature information along with a read command from an external controller is received, and wherein the control logic is configured to differently control the pre-charge operation of the page buffer circuit based on the temperature information provided from the external controller.

7. The memory device of claim 1, further comprising:

a temperature sensor configured to detect a temperature of the memory device;

a clock generator configured to generate a clock signal having different periods according to a result of temperature detection of the temperature sensor; and a voltage generator configured to generate a bit line shutoff signal provided to a gate of a shutoff transistor configured to control an electrical connection between a sensing node and each bit line, and wherein the control logic is configured to adjust a third length of the first period based on counting of the clock signal having different periods according to the temperature.

8. The memory device of claim 7, wherein a period of the clock signal when corresponding to the first temperature is shorter than that of the clock signal when corresponding to the second temperature, and wherein, as a time required to count the clock signal N times is set as the third length of the first period, the first period at the first temperature is set to be shorter than the first period at the second temperature (N is an integer greater than or equal to 1).

9. The memory device of claim 1, wherein the memory cell array comprises a plurality of pages, and a size of data read from each page varies according to an operation mode, wherein the page buffer comprises a shutoff transistor configured to control an electrical connection between a sensing node and each bit line, wherein a bit line shutoff signal is provided to a gate of the shutoff transistor, and wherein a level of the bit line shutoff signal in the first period in a first operation mode in which the size of the read data is smaller is greater than a level of the bit line shutoff signal in the first period in a second operation mode in which the size of the read data is larger.

10. A memory device comprising:

a memory cell array comprising a plurality of memory cells; and a page buffer circuit connected to the memory cell array through a plurality of bit lines, comprising a page buffer connected to each bit line, and configured to perform a pre-charge operation on the plurality of bit lines during a pre-charge period for data reading, wherein each page buffer comprises a shutoff transistor configured to control an electrical connection between a sensing node and each bit line, wherein a bit line shutoff signal is provided to a gate of the shutoff transistor, wherein the pre-charge period comprises an initial first period in which an over drive is performed and a second period thereafter, and wherein, when a temperature of the memory device is lower, a first offset corresponding to a voltage variation of the bit line shutoff signal between the first period and the second period is smaller than, when the temperature is higher, a second offset corresponding to a voltage variation of the bit line shutoff signal between the first period and the second period.

11. The memory device of claim 10, wherein, at the lower temperature, the bit line shutoff signal rises to a first level in the first period, and at the higher temperature, the bit line shutoff signal rises to a second level in the first period, and wherein the first level is higher than the second level.

12. The memory device of claim 11, wherein, at the lower temperature, the bit line shutoff signal falls to a third level in the second period, and at the higher temperature, the bit line shutoff signal falls to a fourth level in the second period, and wherein a difference between the first level and the second level is smaller than a difference between the third level and the fourth level.

13. The memory device of claim 10, wherein the first period at the lower temperature is set to be shorter than the first period at the higher temperature.

14. The memory device of claim 13, wherein the second period at the lower temperature has a same time as the second period at the higher temperature.

15. The memory device of claim 10, wherein each page buffer comprises:

a first transistor connected between the shutoff transistor and the sensing node; and a pre-charge circuit connected to a node between the shutoff transistor and the first transistor and configured to control a pre-charge operation based on a bit line clamping control signal, and wherein, in the pre-charge period, the bit line clamping control signal has a level higher than that of the bit line shutoff signal.

16. The memory device of claim 15, wherein the bit line clamping control signal has different levels at the lower temperature and the higher temperature as compensation for a temperature change is applied to the bit line clamping control signal.

17. The memory device of claim 15, wherein the first transistor is configured to electrically connect the shutoff transistor and the sensing node in response to a first gate signal, and wherein the first gate signal has different levels at the lower temperature and the higher temperature as compensation for a temperature change is applied to the first gate signal.

18. The memory device of claim 10, further comprising:
a temperature sensor configured to detect a temperature of the memory device; and
a control logic configured to differently control the pre-charge operation of the page buffer circuit according to the temperature detected by the temperature sensor,
wherein, as the temperature detected by the temperature sensor decreases, the control logic is configured to increase a level of the bit line shutoff signal in the first period, decrease an offset of the bit line shutoff signal, and set the first period to be shorter.

19. A memory device comprising:
a memory cell area comprising a plurality of memory cells and a first metal pad; and
a peripheral circuit area comprising a second metal pad, and vertically connected to the memory cell area through the first metal pad and the second metal pad,
wherein the peripheral circuit area comprises:
   a page buffer circuit connected to the memory cells through a plurality of bit lines, comprising a page buffer connected to each of the plurality of bit lines, and configured to perform a pre-charge operation on the plurality of bit lines during a pre-charge period for data reading; and
   a control logic configured to differently control the pre-charge operation of the page buffer circuit according to a temperature, and
wherein the pre-charge period comprises an initial first period in which an over drive is performed and a second period thereafter, and when a temperature of the memory device is a lower temperature, a first offset corresponding to a voltage variation of a bit line shutoff signal between the first period and the second period is smaller than, when the temperature is a higher temperature, a second offset corresponding to a voltage variation of the bit line shutoff signal between the first period and the second period.

20. The memory device of claim 19, wherein the first metal pad and the second metal pad comprise copper.

* * * * *